US009671601B2

(12) United States Patent
Krueger et al.

(10) Patent No.: US 9,671,601 B2
(45) Date of Patent: Jun. 6, 2017

(54) MICROSCOPE HAVING AN AUTOFOCUSING DEVICE AND AUTOFOCUSING METHOD FOR MICROSCOPES

(71) Applicant: Leica Microsystems CMS GmbH, Wetzlar (DE)

(72) Inventors: Ralf Krueger, Butzbach Griedel (DE); Tobias Bauer, Koenigstein / Ts (DE)

(73) Assignee: Leica Microsystems CMS GmbH, Wetzlar (DE)

( * ) Notice: Subject to any disclaimer, the term of this patent is extended or adjusted under 35 U.S.C. 154(b) by 274 days.

(21) Appl. No.: 13/962,136

(22) Filed: Aug. 8, 2013

(65) Prior Publication Data

US 2013/0342902 A1    Dec. 26, 2013

Related U.S. Application Data

(63) Continuation of application No. PCT/EP2012/052097, filed on Feb. 8, 2012.

(30) Foreign Application Priority Data

Feb. 8, 2011    (DE) .................. 10 2011 003 807

(51) Int. Cl.
*G02B 21/00* (2006.01)
*G01B 9/04* (2006.01)
(Continued)

(52) U.S. Cl.
CPC ........... *G02B 21/06* (2013.01); *G02B 21/242* (2013.01); *G02B 21/244* (2013.01);
(Continued)

(58) Field of Classification Search
CPC .... G02B 21/06; G02B 21/241; G02B 21/242; G02B 21/244; G02B 21/245;
(Continued)

(56) References Cited

U.S. PATENT DOCUMENTS 3,958,884 A * 5/1976 Smith ........................... 356/495
4,958,920 A * 9/1990 Jorgens et al. ............... 359/392
(Continued)

FOREIGN PATENT DOCUMENTS

DE    2518047 A1    11/1975
DE    3219503 A1    12/1983
(Continued)

OTHER PUBLICATIONS

International Search Report for International Application No. PCT/EP2012/052097 filed Feb. 8, 2012, mailed May 21, 2012.
(Continued)

*Primary Examiner* — Bumsuk Won
*Assistant Examiner* — Collin X Beatty
(74) *Attorney, Agent, or Firm* — Patentbar International, P.C.

(57) ABSTRACT

A method for autofocusing in microscopic examination of a specimen located at the focus of a microscope objective uses an autofocus beam path, the autofocus beam path being directed, via a deflection device arranged on the side of the microscope objective facing away from the specimen, toward the microscope objective, and from there onto a reflective autofocus interface in the specimen region. The autofocus beam path is reflected at the autofocus interface and directed via the microscope objective and the deflection device toward an autofocus detector. The deflection device comprises two regions spaced apart from one another in a propagation direction of the autofocus beam path. Each region reflects the autofocus beam path. The autofocus detector is arranged in a plane conjugated with the microscope objective pupil to acquire an interference pattern. The focus of the microscope is adjusted as a function of the acquired interference pattern.

22 Claims, 14 Drawing Sheets

(51) Int. Cl.
*G02B 21/06* (2006.01)
*G02B 21/24* (2006.01)
*G03F 9/00* (2006.01)
*G03B 13/36* (2006.01)

(52) U.S. Cl.
CPC .......... *G02B 21/245* (2013.01); *G02B 21/006* (2013.01); *G03B 13/36* (2013.01); *G03F 9/7026* (2013.01)

(58) Field of Classification Search
CPC .......... G02B 21/006; G02B 7/09; G02B 7/28; G02B 7/282; G02B 7/343; G02B 7/346; G01J 9/0215; G03F 7/70641; G03F 9/7026; G03B 13/00; G03B 13/36; G03B 2213/00; G01B 9/02; G01B 9/02032; G01B 9/02098
USPC ................ 250/201.4, 201.2, 201.8; 356/520; 359/370, 383, 698
See application file for complete search history.

(56) References Cited

U.S. PATENT DOCUMENTS

| | | | |
|---|---|---|---|
| 5,136,149 A | 8/1992 | Fujiwara | |
| 5,956,141 A | 9/1999 | Hayashi | |
| 6,081,333 A * | 6/2000 | Perchak | 356/520 |
| H001972 H * | 7/2001 | Inoue | 356/450 |
| 7,345,814 B2 | 3/2008 | Yoneyama | |
| 2004/0051877 A1 | 3/2004 | Erwin | |
| 2004/0113043 A1 | 6/2004 | Ishikawa | |
| 2008/0142681 A1* | 6/2008 | Takizawa et al. | 250/201.3 |
| 2008/0151097 A1 | 6/2008 | Chen | |
| 2010/0128276 A1* | 5/2010 | De Groot | G01B 11/2441 356/450 |
| 2011/0188053 A1* | 8/2011 | Buermann | G02B 21/247 356/609 |
| 2012/0008150 A1* | 1/2012 | Smith et al. | 356/616 |

FOREIGN PATENT DOCUMENTS

| | | |
|---|---|---|
| DE | 278640 A1 | 5/1990 |
| DE | 19537376 A1 | 4/1996 |
| DE | 60116268 T2 | 9/2006 |
| JP | 2007-147749 A | 6/2007 |
| WO | 2009092555 A1 | 7/2009 |

OTHER PUBLICATIONS

E. Hecht, "Optik," 1992, 2nd edition, Chapter 9 and Chapter 11, Addison-Wesley Publishing Company.

Steven Lehar, "An Intuitive Explanation of Fourier Theory," at the web site http://cns-alumni.bu.edu/~slehar/fourier/fourier.html, Apr. 23, 2007.

* cited by examiner

MICROSCOPE HAVING AN AUTOFOCUSING DEVICE AND AUTOFOCUSING METHOD FOR MICROSCOPES

RELATED APPLICATIONS

This application is a Continuation application of International Application PCT/EP2012/052097, filed on Feb. 8, 2012, which in turn claims priority to German Patent Application DE 10 2011 003 807.8-56, filed Feb. 8, 2011, both of which are incorporated herein by reference in their entirety.

FIELD OF THE INVENTION

The present invention relates to a method for autofocusing, in the context of microscopic examination of a specimen located at the focus of a microscope objective of a microscope, using an autofocus beam path, and to a microscope having a corresponding autofocus device.

In the context of microscopic examination of specimens, it is usual to focus on a "region of interest" in order to obtain a magnified sharp image of that region for examination. It is often necessary to readjust the focus in the course of an examination, for example when living specimens or cells are involved and/or when the optical distance between the objective and the region of interest changes as a result of thermal influences or vibrations. So-called autofocus devices, of which a variety of kinds are known for microscopy, are used to locate and hold the focus. Most autofocus methods fall into two categories, namely position sensing and image content analysis. Examples of these are discussed in further detail with reference to the existing art that is explained below.

In practice, autofocus is often set to be sharp at a defined interface, e.g. a sample surface in air or an interface between a sample liquid and glass. This can be done either manually by the user while visually monitoring the sample, or by a special focus search run of the autofocus device. The actual microscopic examination can then proceed with an "offset," the autofocus being adjusted by the user to a different, more effectively sensed interface than the visual focus, which is located on the region of interest being examined. An "autofocus offset" of this kind requires that the distance between these two foci be known, for the example the coverslip thickness of a microscopic prepared specimen or the base thickness of a Petri dish in which the visually observed sample is located.

A focus hold—in which the focus selected by the user is continuously corrected if it happens to become misadjusted because of, for example, thermal effects or vibrations—on a defined interface, for example between a coverslip or glass and an aqueous solution, is advantageous especially in the case of long-duration microscopic examinations (e.g. of cell samples).

BACKGROUND OF THE INVENTION

The so-called "triangulating" autofocus device as known from U.S. Pat. No. 5,136,149 B1 belongs to the aforementioned category of position-sensing autofocus devices. DE 195 37 376 A1 refers to the autofocus principle described in the aforesaid US patent document as a "triangulating" autofocus principle. Autofocus devices of this kind, also called "autofocus scanning" units, use an autofocus measuring beam, incident obliquely or in raking fashion onto a specimen, as an autofocus beam path; this measuring beam is focused by the objective of the microscope onto the specimen, where a measurement pattern, generally in the form of a spot or slit, is produced. This autofocus principle requires a mirror-reflective or evenly reflective autofocus interface. After reflection, the measuring beam passes again through the microscope objective and can then be diverted into a position-sensitive autofocus detector. This detector detects the lateral shift of the measuring beam, the reason being that if the distance between the objective and the autofocus interface ("focus hold") changes, a lateral shift of the measuring beam occurs at the detector, with the result that a signal modified with respect to the focus position can be generated. The degree of defocusing can thereby be measured, and then compensated for using suitable means. One compensation possibility is a motor that moves the objective lens correspondingly in order to cancel out the change that occurred in the distance between objective and autofocus interface. Further details regarding the configuration and manner of operation of a triangulating autofocus device may be gathered from the previously mentioned documents U.S. Pat. No. 5,136,149 B1 and DE 195 37 376 A1.

DE 32 19 503 A1 discloses a similar autofocusing device for optical equipment, in particular incident-light microscopes. With this apparatus a laser autofocusing arrangement is provided which generates a measuring beam bundle one of whose halves is blocked out by means of an optical component. The measuring beam bundle, limited to half its cross section, is coupled as an autofocus measuring beam into the illumination beam path of the incident-light microscope, which in turn is incident via the objective pupil and the objective onto a specimen. The half-blocked measuring beam—preferably pulsed laser light in the IR region—thereby generates a measurement spot (which does not interfere with microscopic observation) on the specimen for autofocusing. In the event of defocusing, this measurement spot "migrates" over the surface of the specimen. After reflection at the specimen surface, the remitted autofocus measurement (half-) beam proceeds back to the optical component (deflection prism) and from there to a detector that can be made up substantially of a differential diode (two diodes). When the system is optimally focused, the image of the measurement spot is located in an exactly symmetrical position with reference to the two diodes of the detector. In the event of defocusing, the image of the measurement spot migrates out of the central position toward one of the two diodes, depending on the defocusing direction. To a first approximation, the magnitude of the displacement of the measurement spot on the differential diode is proportional to the magnitude of the defocusing. The apparatus allows the detected defocusing to be canceled out by corresponding counter-control of the objective and/or of the specimen stage in the Z direction (direction of the optical axis).

An autofocus system having a similar measurement principle is also known from US 2004/0113043 A1. The correlation between the detected signal and the actual focus position is depicted graphically in this US document.

A similar autofocus system for an inverted microscope with transmitted illumination is known from U.S. Pat. No. 7,345,814 B2. To minimize flare, a polarizing beam splitter and a λ/4 plate are provided in the beam path of the autofocus apparatus.

DE 601 16 268 T2 also describes a variety of embodiments of an autofocus device for a high-throughput screening microscope, in which the displacement and shape of an autofocus measurement spot acquired by an autofocus detector are analyzed in order to determine therefrom the degree of defocusing and then to keep the focus constant during a screening procedure.

WO 2009/092555 A1 describes an autofocus method of the second category, namely image content analysis, for microscopes. Here a grating incorporated obliquely into the illumination beam path in the illuminated field plane is imaged onto a specimen as a focusing image, for autofocusing purposes, by means of an autofocusing optical system, deflection mirrors, and the microscope objective. The grating can be embodied, for example, as a groove grating. In the arrangement described therein, the focusing image plane in which the grating focusing image is located encloses a specific angle with the focal plane of the imaging optical system of the microscope. When focusing is optimal, the focusing image acquired by a CCD camera of the microscope is sharpest along the intersection line of the two aforesaid planes that lies at the center of the image, and the sharpness decreases outward in both directions. The same is true of the contrast of this image. If the specimen becomes defocused, said intersection line migrates in a lateral direction, and the location of the best image of the grating focusing image shifts correspondingly. Defocusing of the specimen (i.e. a deviation in the Z direction) results in a lateral displacement of the location of the sharpest image on the CCD detector. This document proposes to derive an intensity profile from the focusing image acquired by the CCD camera, and to ascertain from that profile intensities that can be plotted as a function of distance Z from the focal plane. An intensity maximum is thus located at the optimal focus location. In addition, a contrast profile can be derived from the intensity profile by way of a convolution operation. Once again, a contrast maximum is located at the point of optimal focus. A control unit calculates the defocusing on the basis of the profiles, and compensates for it by correspondingly displacing the specimen stage of the microscope.

In the case of the above-described triangulating autofocus devices, the lateral displacement of the center point of the measurement spot, the edge location of the measurement spot or slit, or a fitted profile is used as a signal from which the degree of defocusing is derived. In the case of the autofocus device just mentioned, a signal of this kind is obtained from the intensity or contrast of an imaged grating. The entire imaging path, from the light source (or a structure in the field diaphragm) through the objective and the specimen to the detector, is relevant to the signal that is to be evaluated. If components such as a light source, detector, or deflection elements shift as a result of thermal drift, this directly influences the signal. Errors in determining the defocusing are thereby caused, resulting in inaccurate autofocusing. It typically takes two hours and more for a corresponding configuration to be sufficiently thermally stable to allow precise long-duration experiments to be carried out.

In a method according to WO 2009/092555 A1 (see statements above), the interface between the coverslip and an aqueous sample embedding medium is also imaged onto the detector, the interface being imaged directly onto the CCD detector. Located in this interface are not only the cells that are intended to be observed, but also impurities, scratches, bubbles, and other disruptions that are overlaid directly onto the image and thus onto the signal that is derived, and consequently complicate or distort the evaluation.

SUMMARY OF THE INVENTION

The object that presents itself in this context is that of describing a method and an apparatus for autofocusing in microscopes, which allow rapid and precise autofocusing with a lower degree of error susceptibility.

This object is achieved, according to the present invention, by the features of the independent claims. Advantageous embodiments of the invention are evident from the respective dependent claims and the description that follows.

In the method according to the present invention for autofocusing, in the context of microscopic examination of a specimen located at the focus of a microscope objective of a microscope, using an autofocus beam path, the latter is directed, via a deflection device arranged on the side of the microscope objective facing away from the specimen, toward the microscope objective, and from there onto a reflective autofocus interface in the specimen region, and the autofocus beam path reflected at that autofocus interface is directed via the microscope objective and the deflection device toward an autofocus detector. In order to generate interfering sub-beams of the autofocus beam path, the deflection device comprises two regions that are arranged behind one another in a propagation direction of the autofocus beam path, i.e. are spaced apart from one another, each reflecting said autofocus beam path at least in part. The autofocus detector is arranged in a plane conjugated with the microscope objective pupil in order to acquire an interference pattern that is generated there (and consequently also in the microscope objective pupil itself). The focus of the microscope is then adjusted as a function of this acquired interference pattern; this is to be understood as an initial focus setting (so-called focus search run), but also as holding of a previously established focus position during the microscopic examination.

The basic idea of the present invention is autofocusing by means of interferometry. For this, the autofocus beam path is split or divided into sub-beams that are caused to interfere. This interference must be sensitive with respect to a focus shift, i.e. with reference to the change in the distance between a specimen (more precisely a reflective autofocus interface in the specimen region) and a microscope objective. The proposed invention thus involves a new category of autofocus procedure in addition to the previously mentioned categories of autofocusing by means of position sensing and image analysis. It has become apparent that an interference pattern acquired by an autofocus detector (for example a CCD chip) can be evaluated, in terms of various properties that change as a function of focus, in order to derive therefrom signals so as to apply control to a focus adjustment device that in turn cancels out a defocusing that exists, or counteracts a defocusing.

Be it noted at the outset that a configuration (to be explained below) is possible in which no interference pattern is visible in the case of optimal focus adjustment, and in which an interference pattern occurs only in the event of defocusing. With such a configuration the focus of the microscope is consequently adjusted as a function of the acquired interference pattern so that the latter disappears.

As a general rule, the acquired interference pattern is an interference stripe pattern. A configuration (also further explained below) in which a characteristic interference stripe pattern exists (i.e. is detected) in the case of optimal focus adjustment is preferred, such that upon defocusing, the properties of the interference stripe pattern change.

Included among the aforesaid focus-dependent properties of the interference pattern are the orientation of the stripes in the interference pattern, their density, and the phase angle of the interference pattern. Interference of the sub-beams of the autofocus beam path results, as explained in detail below, in an interference stripe pattern on the sensitive detector surface. It is also possible to select a configuration in which an interference stripe pattern does not occur until defocusing is present. The orientation (i.e. the slope or slope angle) of the stripes in the interference pattern, but also their density, changes as a function of the degree of defocusing. Lastly, the "phase angle" of the interference pattern changes. This is understood as follows: with increasing defocusing, the stripes are displaced in such a way that one stripe takes the place of the next, and so forth. This effect is commonly known in physics in the context of interference patterns. It is thus possible to define a phase angle of 360° that has been traversed when one stripe has taken the place of the next. Corresponding partial path lengths can then be described with a phase angle of between 0° and 360°. A "stripe" is understood as a brightness maximum or brightness minimum in the interference pattern.

It has become apparent that the density of the stripes in the interference pattern, in other words their spatial frequency, can advantageously be employed for evaluation of the interference pattern for autofocusing purposes. It has further become apparent that the aforesaid phase angle of the interference pattern reacts very sensitively, i.e. highly dynamically, to the slightest defocusing. It is therefore advantageous to evaluate the focus setting firstly on the basis of an evaluation of the stripe density in the interference pattern, and additionally (if desired) to evaluate the phase angle of the interference pattern for fine adjustment of the focus. Further details regarding evaluation and embodiments thereof are described in detail below.

Be it noted that in the context of the proposed invention, the detector is arranged not in the image plane (as in the case of the previously known categories of autofocusing), but instead in a plane conjugated with the microscope objective pupil.

Be it further noted that the basic principle of the invention could in principle also be implemented using a Mirau or Michelson interferometer known from the existing art. Such arrangements would, however, have several disadvantages as compared with the arrangement proposed according to the present invention: The design of a Michelson interferometer requires a reference beam path having corresponding optical path lengths ("arms"), that would take up too much space. The construction of a Mirau interferometer requires a reference mirror for the accommodation of which, between the objective and sample, no room would be available with the microscopes under discussion here.

According to the present invention, a focus-sensitive interference is created as follows: The autofocus beam path is coupled into the microscope beam path by means of the aforementioned deflection device so as to be incident, through the microscope objective, onto the aforesaid autofocus interface in the specimen region. Because the deflection device comprises two spaced-apart regions or segments that each reflect the autofocus beam path, and that are arranged behind one another in a propagation direction of the autofocus beam path, the autofocus beam path becomes split: on the one hand, one sub-beam is reflected at the region located in front in a propagation direction, hereinafter referred to as a first front sub-beam; on the other hand, another sub-beam is reflected at the region located therebehind in a propagation direction, hereinafter referred to as a first rear sub-beam. The two sub-beams at first proceed in parallel toward the objective. It is assumed in this context that the deflection element is arranged at a 45° angle with respect to the incident autofocus beam path. The two sub-beams meet at the focus of the microscope and are reflected at the reflective autofocus interface in the specimen region, which in turn is located at the focus. These sub-beams in turn travel through the microscope objective back to the deflection element, at which once again each of the sub-beams is reflected at the front region, and at the region located therebehind, of the deflection device. The sub-beams reflected in this fashion lastly proceed to an autofocus detector, which is arranged in a plane that is conjugated with the microscope objective pupil. The detector, configured e.g. as a CCD camera, generates an image that exhibits interferences of various orders between the sub-beams that reach the detector. Higher-order interferences are lower in brightness and contrast. The sub-beams respectively reflected at the front regions of the deflection device on the outward and return travel result in a uniformly illuminated portion on the detector surface ("region 1"). A portion of the first front sub-beam is reflected, after proceeding back to the deflection device, at its rear region, while a portion of the first rear sub-beam is reflected, after proceeding back to the deflection device, at its front region. These two reflected sub-beams interfere when optical path differences exist, thus resulting in an easily evaluated interference stripe pattern on the detector surface ("region 2"). Further possible interferences result from superpositions of further sub-beams. These interferences in further regions ("region 3," etc.) on the detector surface are, however, lower in brightness and contrast and are therefore less effective for use in evaluation, although there is no intention to preclude possible evaluation of these interference patterns.

The configuration described can be varied, by selecting the spacing of the two spaced-apart reflecting regions of the deflection device for the incoupled autofocus beam path (i.e. the one incident onto the deflection element) and the outcoupled autofocus beam path (i.e. the autofocus beam path proceeding from the deflection element toward the detector), in the following fashion: If the spacing of the regions is identical, for example when a plane-parallel splitter, or in general two spaced-apart plane-parallel surfaces each reflecting the autofocus beam path, are used, no interference stripe pattern occurs on the autofocus detector when the focus setting is optimal. Definite interference stripes occur only in the context of a defocusing, which causes the sub-beams to travel along different optical path lengths.

If, however, the spacing of the aforesaid regions is selected to be different, a "baseline" interference is then already created in the optimal focus setting, for example in the above-described "region 2" on the detector surface, since the corresponding sub-beams are traveling along different optical path lengths. Proceeding from this baseline interference, a defocusing can be detected on the basis of a change in the interference pattern, and canceled out. One possibility for embodying the aforesaid regions of the deflection device at different spacings is the use of an optical wedge. The wedge angle can be selected in such a way that in the case of optimal focus adjustment a "baseline" interference becomes visible, and changes depending on the direction of defocusing. For example, upon defocusing in a first direction, the optical path length difference present as a result of the wedge angle can be increased, whereas upon defocusing in the other direction, the optical path length difference caused by the wedge angle becomes compensated for. With this type of configuration, focus adjustment can occur over a relative wide range.

In another embodiment, the wedge angle of the optical wedge serving as a deflection device can be selected in such a way that a superposition of interferences from different spatial directions occurs. At one orientation (to be explained below) of the wedge angle, interference stripes oriented in a predefined direction on the detector surface can be generated as a "baseline" interference at an optimal focus setting, and can advantageously serve as a setpoint for focus adjustment. For autofocusing, characteristics of this interference stripe pattern, such as the stripe density and/or stripe slope, are evaluated. This baseline interference pattern changes in the event of defocusing, i.e. its characteristics (such as the stripe slope and stripe density) change. The previously explained phase angle also changes, and can be employed for evaluation.

It has become apparent that the use of an optical wedge as a deflection element, and thus the presence of a baseline interference pattern at the optimal focus setting, is advantageous for rapid and precise detection of defocusing. Even a small wedge angle (a few minutes of arc) of the optical wedge is sufficient. The use of an optical wedge has the further advantage of lower flare sensitivity. The alternative configuration with a plane-parallel dichroic plate, in which no interference stripes are observable in the case of an optimal focus setting but interference stripes occur only in the case of defocusing, is achievable with the present invention but is less preferred.

The autofocusing method proposed according to the present invention can be implemented in principle with any light sources for generating the autofocus beam path. For example, a usual white light source can be used. To increase the contrast of the detected interference pattern, it is useful to operate the white light source with a monochromatic filter. In practice, an LED light source is preferably used. Monochromatic laser light is also usable, although undesired interference effects are to be expected because of the very long coherence length of the laser light, since the other optical interfaces of the microscope (other than the deflection element) can also contribute to the interferences. The wavelength of the autofocus beam path should usefully be outside the wavelength regions that are used for microscopic examination. Frequencies in the infrared spectral region have proven favorable.

It is advantageous to use as a deflection device a dichroic splitter (or simply "dichroic") that at least in part reflects the autofocus beam path, and whose two delimiting surfaces located in the autofocus beam path form the two regions that are spaced apart in a propagation direction and reflect the autofocus beam path.

A dichroic that is predominantly reflective for the wavelength of the autofocus beam path, while being predominantly transmissive for the microscopic observation wavelengths, is used. This prevents light from the autofocus beam path from getting into the observation beam path of the microscope. A further result is that most of the autofocus beam path coupled into the microscope beam path reaches the autofocus detector. It has become apparent that the physical delimiting surfaces of a dichroic splitter of this kind, which as a rule represent planes extending in plane-parallel fashion with respect to one another, are best suited for generating sub-beams of the autofocus beam path.

The two spaced-apart regions of the deflection device can extend plane-parallel to one another or can be embodied as planes extending in wedge-shaped fashion at a wedge angle to one another. The basic prerequisite is that the autofocus beam path encounter two reflective regions located in its propagation direction, with the result that it is divided into sub-beams. If said regions extend plane-parallel to one another, the optical path lengths of the sub-beams responsible for the above-defined "region 2" of the detector surface are identical, and an interference pattern does not occur in the case of optimal focus adjustment, but occurs only in the event of defocusing. In the case of the planar regions extending in wedge-shaped fashion at a wedge angle to one another, these sub-beams already have different optical path lengths in the focused setting. A "baseline" interference, i.e. a baseline interference pattern that can be used as a reference value, thus already occurs in the case of an optimal focus setting. Proceeding therefrom, changes occur in the baseline interference pattern in the event of defocusing, in terms of the orientation and density of the stripes and in terms of the phase angle of the interference pattern, as already discussed above.

An angle of between 0.5' and 10' can be selected as a wedge angle; as the wedge angle increases, the stripe density rises but the contrast of the interference stripe pattern is decreased. A correspondingly more sensitive detector is needed in order to evaluate the stripe pattern. An angle of between 0.5' and 2' is preferably selected as a wedge angle, since this allows good evaluation of the high-contrast interference stripe pattern even with a detector of average sensitivity.

As already explained in the introductory part of the specification, it is useful to operate the autofocusing system with an "offset," i.e. not to scan the visually observed sample but instead to place the focus position of the autofocus beam path onto a highly reflective interface in the specimen region ("autofocus interface"). The interface between a glass cover, here typically embodied as the base of a Petri dish, and a sample medium is particularly suitable for this. Alternatively, the interface between the side of the glass cover facing away from the sample and air, in particular between the side of the Petri dish base facing away from the sample medium and the air between the Petri dish and the inverted microscope objective located therebeneath, can be used for scanning with the autofocus beam path.

Evaluation of the interference pattern will be explained in more detail as follows:

The interference stripe pattern can be evaluated in terms of the stripe density, i.e. the spatial frequency of the interference stripes. As will be explained below, a linear characteristic curve that can be used for focus adjustment can be derived by means of Fourier transformation.

The orientation of the stripes in the interference pattern can furthermore be evaluated. For this, the slope angle of the stripes in the interference pattern is plotted as a function of the degree of defocusing. The characteristic curve resulting therefrom can also be used for focus adjustment. This will be further discussed later on.

Lastly, the phase angle of the interference pattern can be plotted as a function of the degree of defocusing. This results in steep characteristic curves that can be used in particular for fine adjustment, i.e. for precise autofocusing in a small region around the focus. This, too, will be discussed in further detail later on.

It is useful in practice to perform the focus adjustment firstly on the basis of the evaluation of the stripe density in the interference pattern and then, optionally, to additionally evaluate the phase angle of the interference pattern for fine adjustment of the focus. This method—evaluation of the stripe density followed by evaluation of the phase angle—has proven in practice to be the most suitable.

It is advantageous to use a Fourier transformation, in particular a Fast Fourier Transformation (FFT), to evaluate the interference pattern, in particular in terms of stripe density; for this, a portion of the interference pattern acquired by the autofocus detector is Fourier transformed.

For an explanation of how the interference pattern is evaluated by Fourier transformation, let it be assumed that for the case of optimal focus adjustment, a baseline interference pattern made up of vertically extending alternately light and dark stripes (corresponding to the intensity maxima and intensity minima in the interference pattern) is acquired by the autofocus detector. In the event of defocusing, for example a displacement of the interface 50 μm below the focus, the stripes slope to the right, i.e. the slope angle becomes negative with respect to the vertical. At the same time, the stripe density increases. Evaluation by means of Fourier transformation will now be explained further using these assumptions, the basic principles of Fourier transformation being taken as known:

A Fourier transformation causes a pattern that exists in the spatial domain to be transformed into the spatial frequency domain, so that the spatial frequencies in the X and Y directions present in the pattern become visible. In the case of a vertical stripe pattern, in which the stripes extend parallel to the Y axis in the spatial domain, a maximum in the X direction is thus obtained in the spatial frequency domain at the point that corresponds to the frequency of the stripes. In addition, at a spatial frequency of zero a principal maximum is obtained which corresponds to the average brightness of the pattern, as well as a further maximum in the X direction at a point that corresponds to the frequency of the stripes with a negative sign. The maximum at the spatial frequency of zero will hereinafter be referred to as a "principal maximum," while the two maxima at the points of positive and negative spatial frequency will be respectively referred to as "secondary maxima."

In the case of a stripe pattern with a negative slope angle, Fourier transformation once again yields a principal maximum in the spatial frequency domain, together with secondary maxima that are arranged alongside the principal maximum. Because spatial frequencies exist in this case in both the X direction and the Y direction, the corresponding maxima in the spatial frequency domain have respective components in the X direction and in the Y direction. It is evident that with respect to the Fourier Transform of the vertical stripe pattern, the relative locations of the maxima with respect to one another, i.e. the spacing of the maxima, as well as the absolute position of the maxima, have changed. Looking at the two secondary maxima in the spatial frequency domain, a change is observed in the spacing of the secondary maxima, as well as a change in the orientation of the connecting line between the secondary maxima. This instance is discussed illustratively in the exemplifying embodiments presented later on.

It is thus possible, by evaluating the relative location of the maxima, in particular of the two secondary maxima located around the principal maximum, with respect to one another, in particular the spacing of these secondary maxima, and/or by evaluating the location of one of the maxima, in particular one of the aforesaid secondary maxima, in the coordinate system of the Fourier Transform, to identify a defocusing precisely in terms of magnitude and sign. "Focus position" is understood as the relative position of the objective with respect to the scanned interface. Defocusing is described with a "+" or "−" sign. The sign refers to an upward or downward change in the focus position. Thanks to the high speed of methods known per se for Fast Fourier Transformation (FFT), a fast evaluation method is available.

It has proven particularly advantageous to utilize for evaluation the location, in the Fourier Transform coordinate system, of a secondary maximum adjacent to the principal maximum. These coordinates remain a straight line as defocusing proceeds from above the focus, through the focus, to a point below the focus. This straight line can be generated, for calibration purposes, before the microscopic examination begins. The calibration curve then serves as a control curve for autofocusing during the microscopic examination. Because linear correlations exist and the line possesses a sufficient slope, it is particularly suitable as a control curve for autofocusing.

As already discussed earlier, the phase angle, i.e. the migration of the interference stripes, allows in particular a fine adjustment of the focus position. Here as well, what results is a linear correlation of phase angle as a function of defocusing. Because the corresponding line has a large slope, this is a very sensitive variable that changes considerably with slight defocusing. Because the value "jumps back" as the phase angle cycles from 0° to 360°, the phase angle cannot be utilized for an absolute determination of focus position. The phase angle can also be determined on the basis of the Fourier Transform. The reader is referred to the exemplifying embodiments for further explanations of this.

The slope angle of the interference stripes is not linearly correlated with the focus position; the correlation can be approximated by a straight line only in a small region around the focus position. Outside this region, the slope angle goes toward saturation. This evaluation thus has high sensitivity only in a smaller region around the focus.

The invention further relates to a computer program and to a computer program product having program code means for carrying out the autofocusing method according to the present invention. The computer program is usefully executable in an autofocus evaluation unit of a microscope according to the present invention that will be explained later on. The computer program relates in particular to the steps of acquiring and evaluating the interference pattern, and to application of control to a focus adjustment device as a function of the evaluation result. Usefully, the computer program controls the focus search run and subsequent holding of the previously established focus position during a microscopic examination. In order to hold the focus, the acquired interference pattern is evaluated, for example, twenty times per second and correspondingly refocused on the basis of the results. Because the evaluation is preferably accomplished by means of Fourier transformation, it is a matter of course to use Fast Fourier Transformation (FFT) in the context of evaluation by the computer program, since this can be performed very quickly and computationally effectively.

The computer program can be stored on suitable data media such as EEPROMs, flash memories, but also CD-ROMs, diskettes, or hard drives. Downloading of the computer program via internal or publicly usable networks is also possible.

In addition to the method covered in detail above, the invention also relates to a corresponding microscope having an autofocus device for adjusting the focus of a microscope containing a microscope objective. A microscope of this kind comprises an autofocus illumination optical system for generating an autofocus beam path. It furthermore comprises a deflection device, arranged on the side of the microscope objective facing away from the specimen, for directing the autofocus beam path toward the microscope objective and from there onto a reflective autofocus interface in a specimen region, and for directing the autofocus beam path, which is reflected at the autofocus interface and passes through the microscope objective, toward an autofocus detector, the deflection device comprising, in order to generate interfering sub-beams of the autofocus beam path, two regions that are spaced apart from one another in a propagation direction of the autofocus beam path and each reflect the autofocus beam path. In addition, an autofocus detector for acquiring an interference pattern is arranged in a plane conjugated with the microscope objective pupil. For evaluation of the acquired interference pattern, an autofocus evaluation unit is integrated into the autofocus detector or is in working engagement therewith. Lastly, a focus adjustment device for adjusting the focus of the microscope is in working engagement with the autofocus evaluation unit.

With regard to the manner of operation of the aforesaid components of the microscope according to the present invention having an autofocus device, the reader is referred explicitly to the statements above in conjunction with the method according to the present invention. The same applies to possible embodiments.

It may additionally be mentioned that the focus adjustment device is configured, in order to adjust the focus of the microscope, to modify the distance between the microscope objective and the interface in the specimen region, for which purpose control is usually applied to the Z position of the sample stage and/or, when a "vario objective" is used as a microscope objective, the focal length thereof is modified.

The autofocus device is usable with particular advantage in the context of an inverted microscope.

It is understood that the features recited above and those yet to be explained below can be used not only in the respective combination indicated, but also in other combinations or in isolation, without leaving the context of the present invention.

The invention is schematically depicted in the drawings on the basis of an exemplifying embodiment, and will be described in detail below with reference to the drawings.

DETAILED DESCRIPTION OF THE PREFERRED EMBODIMENTS

Figure 1:
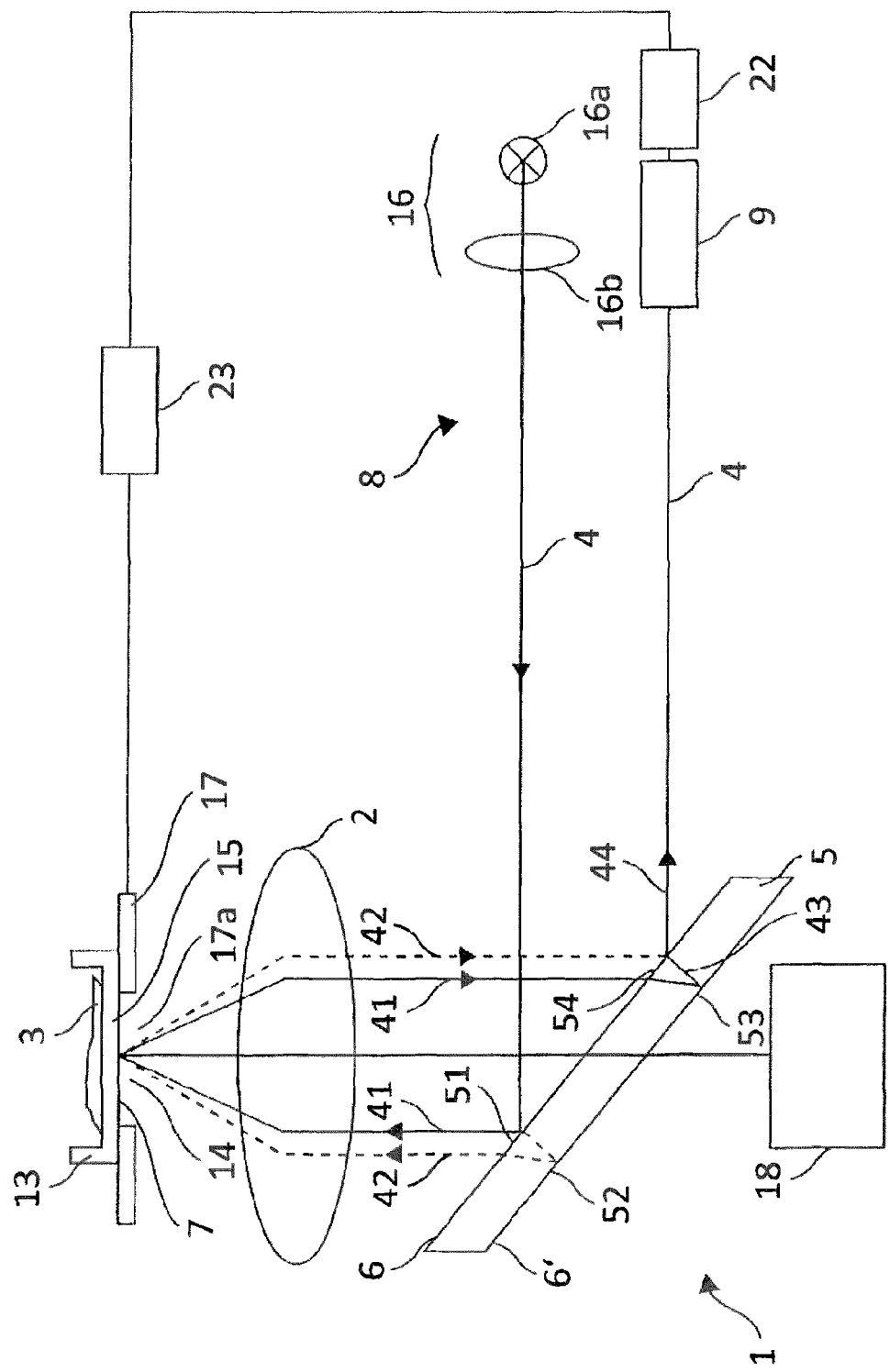
FIG. 1 is a schematic view of the basic beam path of an autofocus device for a microscope according to the invention.

FIG. 1 shows, in a schematic view, a basic beam path of an autofocus device 8 for a microscope 1, substantially only microscope objective 2 of said microscope 1 being depicted. All further components of microscope 1 are indicated as observation optical system 18. Observation optical system 18 encompasses known constituents of a microscope, such as a magnification changer or zoom system, tube, and eyepiece. In addition to or instead of an eyepiece, a camera can be provided for acquisition of the microscope image. The microscope image itself can be displayed, for example, on a monitor. The example depicted here refers to an inverted microscope 1, as often used for "living cell" examinations. This involves working with cell samples that are embedded in an aqueous solution (nutrient solution). Microscope stage 17 possesses a transmitted light opening 17a above which is arranged a Petri dish 13 having specimen 3 that is to be examined. Specimen 3 involves, for example, as already stated, cell samples in an aqueous solution. The base thickness of Petri dish 13 is typically equal to 0.17 mm. Examination of the samples occurs by means of microscopic contrasting methods, for example fluorescence or differential interference contrast (DIC). To allow cell details to be resolved, high-magnification immersion objectives are used almost exclusively, starting at a magnification of 20× (e.g. 63×/1.20 water, or 100×/1.40 oil). The user in most cases searches visually for a specimen location of interest to him or her, and would like to observe it over an extended period of time, for example in the context of a long-term experiment with manipulation of the cell samples. As a general rule, microscope images of the sample region of interest are prepared for this purpose using a digital camera. The optical distance between the observed region and microscope objective 2 can change as a result of thermal influences or vibrations. It is also possible for the sample to involve living cells whose dimension or location changes, for example, as a result of cell division. For useful evaluation of the microscope images, however, it is enormously important to maintain an unchanged distance between microscope objective 2 and the region of interest in order to obtain microscope images of consistent quality. This purpose is served by an autofocus device 8 that, in the exemplifying embodiment considered here, operates with an "offset," in that the autofocus is set to an interface that can be scanned more effectively than the visual focus located on the region of interest to be examined. In the case under consideration, interface 7 between the side of Petri dish base 15 facing away from the specimen, and the air 14 located below the base, is used as autofocus interface 7. The visual focus is then located at a displacement of 0.17 mm (base thickness of Petri dish 13) from said autofocus interface 7.

Autofocus device 8 under discussion here generates an autofocus beam path 4 by means of an autofocus illumination optical system 16. An LED light source in the near infrared spectral region (e.g. 750 nm to 900 nm) serves, in particular, as light source 16a. Alternatively, a white light source having a monochromatic filter can be used. An optical system (here depicted schematically as illumination lens 16b) generates autofocus beam path 4 (see also, in this connection, the explanations of FIG. 5). This autofocus beam path 4 is coupled into the microscope beam path by means of a deflection device 5. Deflection device 5 is located between microscope objective 2 and observation optical system 18, in particular the tube lens of observation optical system 18. Because autofocus is implemented in the near infrared, it does not disrupt either work in the visual spectral region (approximately 400 nm to 700 nm) or examination under fluorescent illumination in the near UV region (approximately 340 nm to 450 nm). Autofocus beam path 4 passes through objective 2 and is reflected at autofocus interface 7, whereupon it passes again through objective 2 and is in turn reflected at deflection device 5 so that it can be received on autofocus detector 9 in a plane conjugated with the objective pupil.

The progress of autofocus beam path 4 as it is reflected at deflection device 5 will now be considered in more detail: Firstly, as is evident from FIG. 1, autofocus beam path 4 is reflected in part in region 51. Sub-beam 41 is created as a result of this reflection. Present behind region 51 is a further spaced-apart region 52 that in turn acts reflectively on the sub-beam that has passed through region 51. Reflection at region 52 of deflection device 5 results in a sub-beam 42 that emerges from deflection device 5 and proceeds toward microscope objective 2. Additional reflections and sub-beams will not be considered hereinafter, since they are not essential for an understanding of the autofocus principle presented here.

After passing through objective 2 and being reflected at autofocus interface 7, sub-beams 41 and 42 propagate further toward deflection device 5, where they encounter regions 54 and 53 that are spaced apart from one another and arranged behind one another in a propagation direction of the autofocus beam path. Let it be emphasized in this connection that "autofocus beam path" is always intended also to encompass the sub-beams that are generated, if they are not explicitly named as such. First front sub-beam 41 is reflected in part (not depicted) at front region 54 and in another part at rear region 53, resulting in a sub-beam 43 that in turn emerges from deflection device 5 (multiple reflections are once again not considered here). First rear sub-beam 42 is reflected in part at front region 54 of deflection device 5. The sub-beam reflected here becomes overlaid with sub-beam 43 to form a sub-beam 44. Additional reflections of sub-beam 42 will not be considered here, since they are not necessary for comprehension. Sub-beam 44 thus contains sub-beam 43, reflected at the rear region of deflection device 5, of first front sub-beam 41; and the sub-beam, reflected at the front region of deflection device 5, of first rear sub-beam 42. This sub-beam 44 is suitable for generating an interference pattern if the two aforesaid sub-beams that form sub-beam 44 exhibit an optical path length difference. The corresponding interference pattern occurs on the detector surface in "region 2" as defined above in the specification. "Region 1" is constituted by sub-beams that have been reflected respectively at front regions 51 and 54. A uniformly illuminated segment on the detector surface is produced in this region. Further regions ("region 3," etc.) likewise exhibit interference patterns, but they are lower in brightness and contrast and are therefore not employed for the evaluation discussed here.

In the case of an optimal focus setting as depicted in FIG. 1, overlaying of the sub-beams that form sub-beam 44 likewise results in a uniformly illuminated segment in region 2 of the detector surface, since it is only in the event of defocusing that a difference in optical path lengths occurs. This instance will be explained with reference to FIG. 2.

As depicted in FIG. 1, an arrangement of regions 51, 52, and 53, 54 for generating the autofocus sub-beams can be implemented in practice by way of a dichroic splitter having delimiting surfaces 6 and 6'. Delimiting surface 6 acts at least in part reflectively for autofocus beam path 4, and the same is true for interface 6'. The dichroic splitter is, on the other hand, transparent to other spectral regions, so that the aforementioned microscopy methods can be carried out with no loss of intensity.

Downstream from detector 9 is an autofocus evaluation unit 22 in which the interference pattern acquired by detector 9 is evaluated, as will be described later on in detail. As a function of the evaluation, a signal is generated that is sent to focus adjustment device 23 so that any defocusing can be canceled out. In the instance depicted in FIG. 1, focus adjustment device 23 applies control to microscope stage 17 for this purpose. Control application proceeds in such a way that the Z drive of microscope stage 17 is controlled, which in turn displaces microscope stage 17 in a Z direction (direction of the principal axis of objective 2). It is advantageous to implement focus adjustment as a control loop so that deviations from the optimal focus setting can be continuously regulated to zero.

Figure 2:
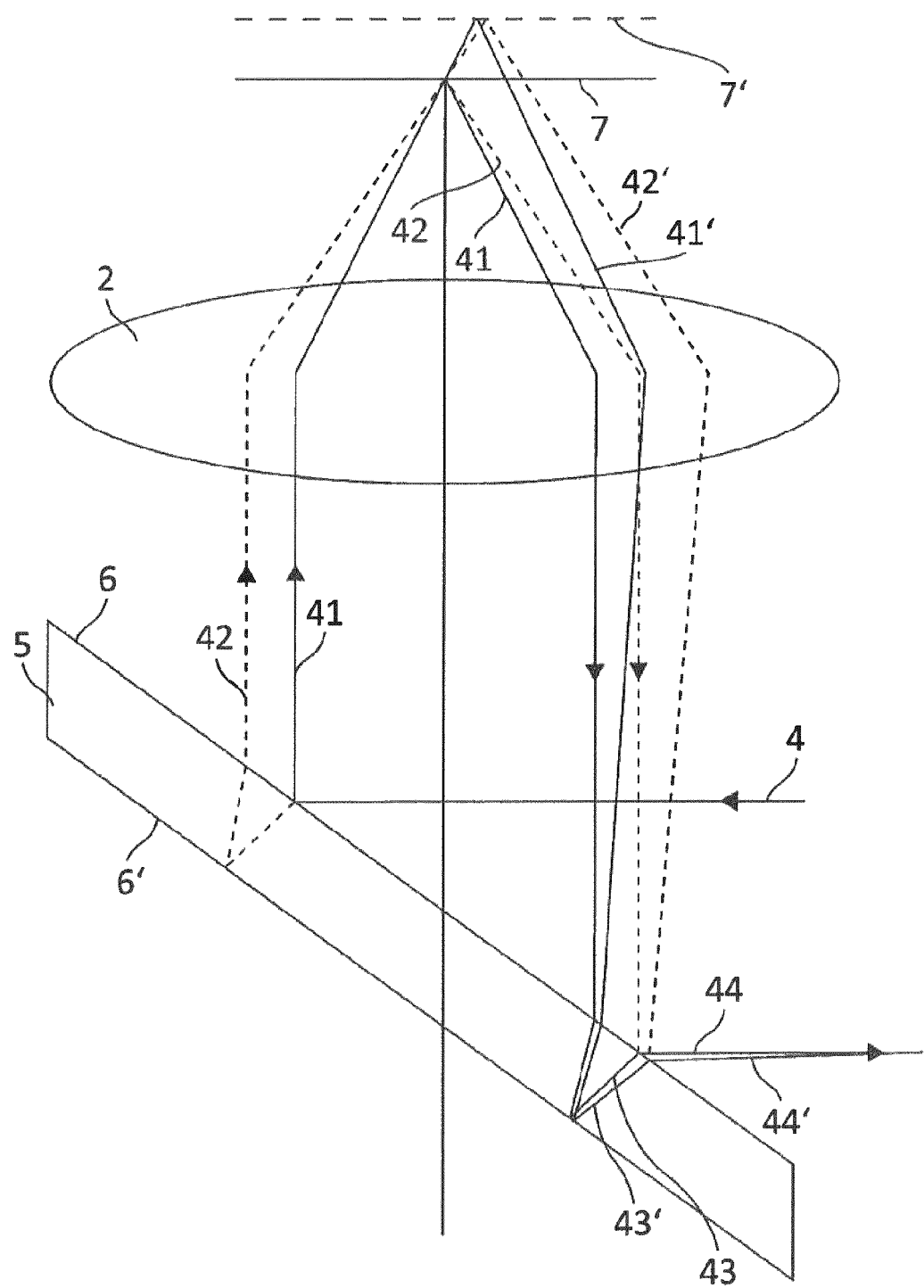
FIG. 2 illustrates, on the basis of a portion of FIG. 1, the conditions with optimal focus adjustment and with defocusing.

FIG. 2 shows a portion of FIG. 1 in order to illustrate the path taken by autofocus beam path 4 between deflection device 5 and autofocus interface 7 in the case of an optimal focus setting and in the case of defocusing. FIG. 2 shows on the one hand the beam profile with an optimal focus setting, when the focus of autofocus device is set at autofocus interface 7. For this instance, the reader is referred to the explanations of FIG. 1. Concurrently therewith, FIG. 2 shows the beam profile in the case of defocusing, i.e. the case of a displacement of autofocus interface 7 into interface 7', for example as a result of vibration or thermal drift. Sub-beams 41 and 42 reflected at interface 7' are labeled 41' and 42', respectively, in FIG. 2. They travel with a lateral offset into objective 2, and from there onto deflection device 5. The lateral offset still present in the objective region between beam paths 44 and 44' is no longer present at the detector surface, since detector 9 is arranged in a plane conjugated with the objective pupil. Sub-beam 44' generated in the case of defocusing is made up of sub-beam 43', which is created from first front sub-beam 41' by reflection in the rear region of deflection device 5, and of first rear sub-beam 42' reflected at the front region of deflection device 5. It is evident from FIG. 2 that the symmetrical conditions that exist when the focus setting is optimal are abolished in the case of defocusing, so that the sub-beams that make up sub-beam 44' exhibit a difference in optical path length. An interference stripe pattern consequently occurs. This interference stripe pattern is most clearly recognizable and detectable in particular in region 2 of the detector surface, as has already been described above.

As has already been explained in detail elsewhere in the specification, it is advantageous to generate a "baseline" interference even in the case of an optimum focus setting. Proceeding from this baseline interference, defocusing can be detected quickly and unequivocally by the fact that characteristics of the baseline interference stripe pattern change. A "baseline" interference of this kind can be generated, for example, by means of a wedge angle in the dichroic splitter, for example by using an optical wedge.

In a first embodiment, let it be assumed that (proceeding from the depiction in FIG. 1) the two delimiting surfaces 6 and 6' enclose a wedge angle between them, such that the wedge angle spans a plane (in this case, the drawing plane) in which the outgoing and returning autofocus beam path 4 is located. In such a case, which can easily be illustrated with reference to the depiction in FIG. 1, the sub-beams constituting sub-beam 44 would need to travel along different optical path lengths even in the case of an optimal focus setting, so that an interference stripe pattern at detector 9 would be the consequence. Defocusing in one direction (for example, in a direction away from objective 2) can increase this optical path length difference, while defocusing in the other direction (for example, toward objective 2) can compensate for the optical path length difference present in the focused setting. In the case of compensation, the interference pattern on the detector would disappear and uniform illumination would be visible.

Figure 3:
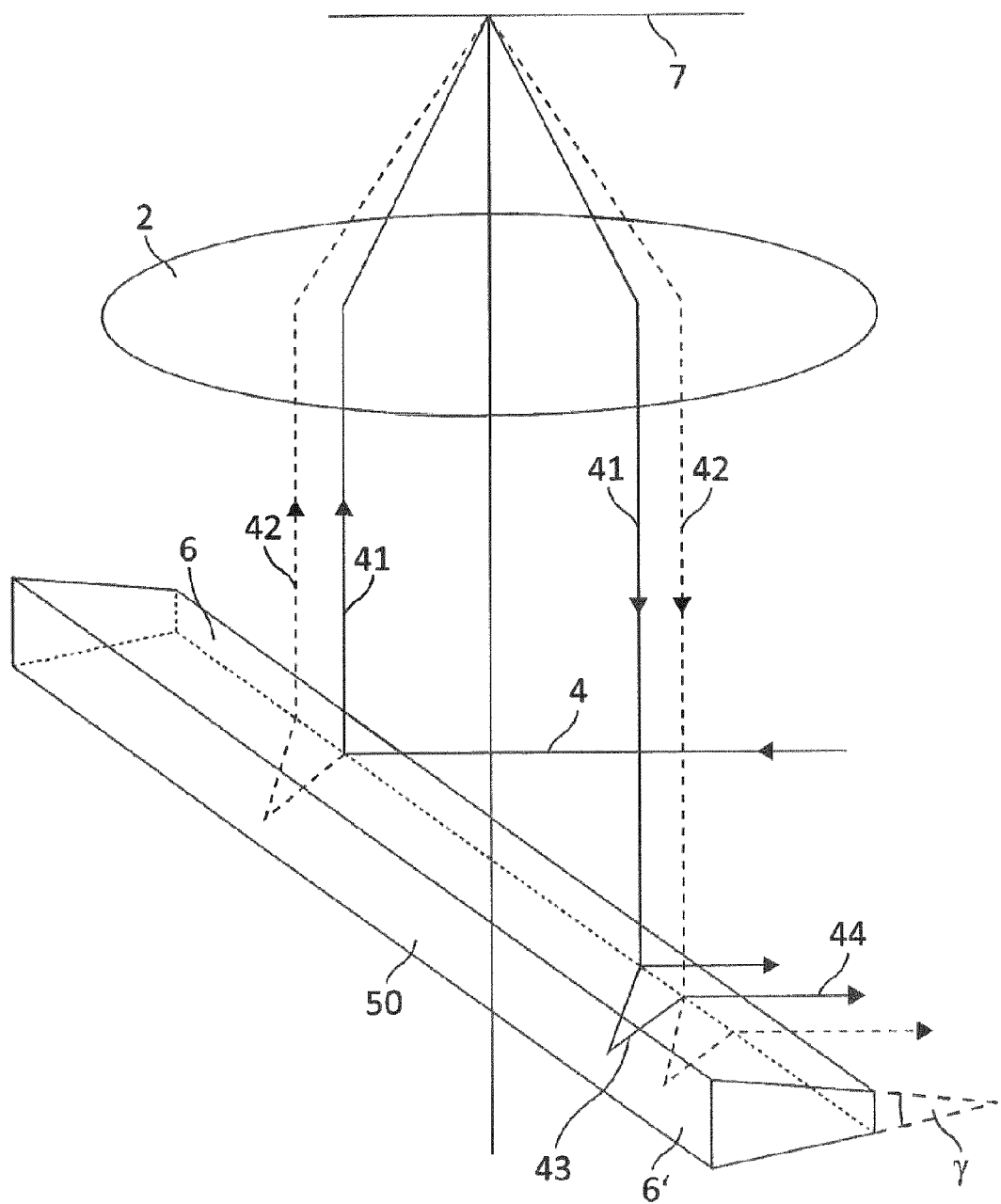
FIG. 3 shows the effect of using an optical wedge as a deflection device.

In a second embodiment, what is used as deflection device 5 is an optical wedge in which the wedge angle spans a plane that is perpendicular to the drawing plane of FIG. 1, i.e. perpendicular to the plane in which the outgoing and returning autofocus beam path 4 is located. This situation is depicted in FIG. 3. It may be gathered that the configuration depicted in FIG. 3 results in a 90° rotation of the slope of the interference stripes. If it is assumed that in a configuration according to FIG. 1, interference stripes that extend substantially horizontally are produced on the detector surface in the event of defocusing, it is then apparent that what occurs in the case of a configuration according to FIG. 3 is a "baseline" interference in which the interference stripes proceed vertically. The interference stripe orientations described here of course serve only for better elucidation of the effects of using an optical wedge as deflection device 5. It is consequently also possible, by way of a corresponding different orientation of the wedge angle between delimiting surfaces 6 and 6', to influence the slope of the interference stripes of the "baseline" interference pattern and adjust it optimally for evaluation purposes.

FIG. 3 shows the use of a preferred optical wedge 50 as deflection device 5, with its delimiting surfaces 6 and 6'. Components and beam paths identical to those in FIG. 1 or 2 are here again labeled with the same reference characters. FIG. 3 once again depicts sub-beam 44, which results in an interference pattern that can be optimally employed for focus adjustment. The corresponding interference pattern occurs in "region 2" on the detector surface (see also FIG. 6). The sub-beam proceeding to the right of sub-beam 44 contains only beams reflected at the front regions of deflection device 5, i.e. at front delimiting surface 6, and results in a uniformly illuminated segment in "region 1" of the detector surface. A further sub-beam, drawn in FIG. 3 with a dashed line on the left side of sub-beam 44, results from the reflection of sub-beam 42 at the rear region of deflection device 5, i.e. at rear delimiting surface 6'. Sub-beams of this kind, created by multiple reflections, produce further regions on the detector surface that, however, are lower in brightness and contrast.

The detector, usually a spatially resolving CCD camera, is arranged in a plane conjugated with the objective pupil. The aforesaid "regions" on the detector surface exhibit a pupil offset of 0.75 times the plate thickness, assuming a plane-parallel plate arranged at a deflection angle of 45 degrees. The height of the respective regions corresponds to the gap width of the slit that is used to generate the autofocus beam path.

Figure 4B:
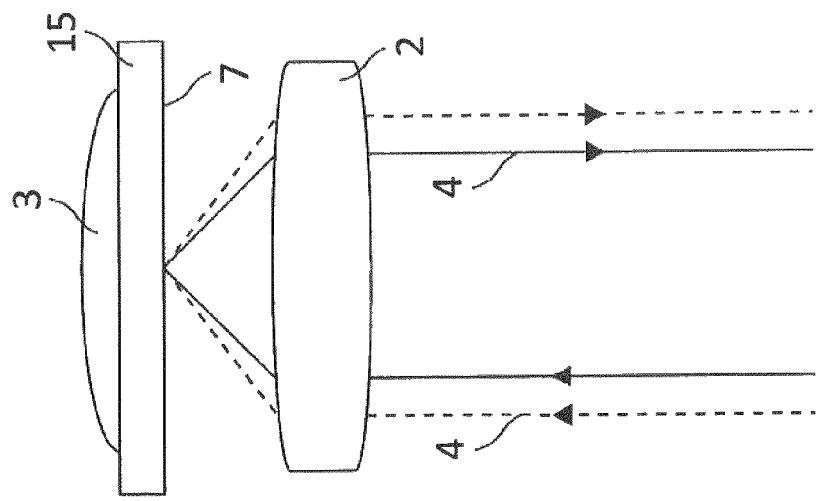
FIGS. 4a and 4b illustrate the selection of suitable autofocus interfaces depending on specimen types.
Figure 4A:
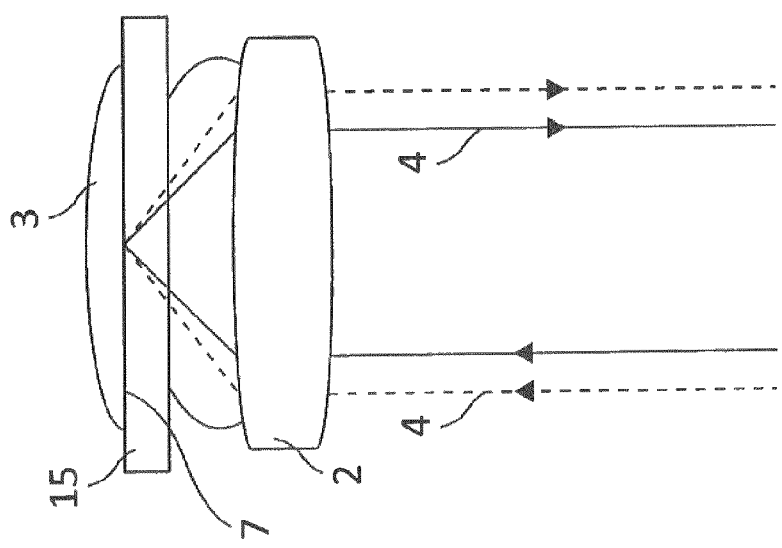

FIG. 4a and FIG. 4b illustrate the selection of a suitable autofocus interface 7 for two different types of objective. FIG. 4a shows an immersion objective, in which an immersion medium (oil) is present in the region between objective 2 and base 15 of the Petri dish. Usefully, what is used here as autofocus interface 7 is the interface between base 15 of the Petri dish and the adjacent sample 3, since this interface reflects autofocus beam path 4 better. FIG. 4b shows the conditions in the case of a dry objective 2 and selection of autofocus interface 7 in accordance with FIG. 1.

Figure 5:
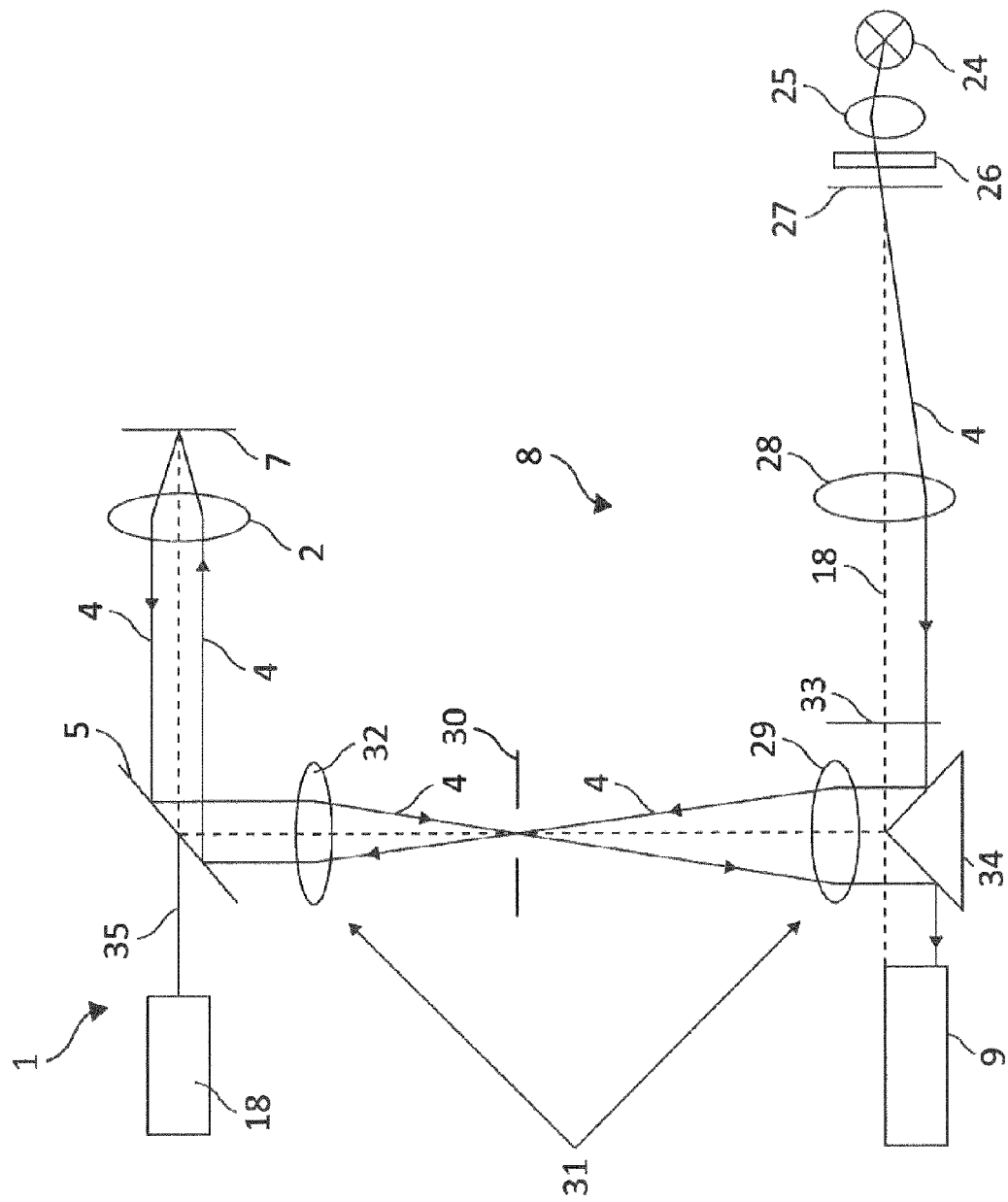
FIG. 5 shows a modified configuration for generating and detecting an autofocus beam path in a microscope.

FIG. 5 shows a modified configuration of the beam paths of an autofocus device 8 in a microscope 1.

Starting from a white light source 24 having a collector 25 and spectral filter 26 in front of it, an illumination spot is generated by means of an aperture 27. Illumination optical system 28, together with focusing lens 29, images the illumination spot into field diaphragm 30. Autofocus beam path 4 is directed to objective 2 of microscope 1 via the so-called transport optical system 31, which encompasses focusing lens 29 (displaceable along the optical axis) and a further transport lens 32. A dichroic beam splitter 5 splits imaging beam path 35 (which leads to the tube of observation optical system 18) of microscope 1 off from beam path 4 (depicted here) of autofocus device 8. Autofocus beam path 4 reaches autofocus interface 7, at which it is reflected.

As is evident from FIG. 5, autofocus aperture stop 33 generates an autofocus beam path 4 in the one half of the cross section of a ray bundle extending along optical axis 18, such that autofocus beam path 4 proceeds decenteredly from optical axis 18.

Autofocus beam path 4 that is remitted, i.e. reflected from interface 7 in turn travels, as schematically depicted in FIG. 5, via beam splitter 5 and transport optical system 31 to deflection prism 34. Autofocus beam path 4 is reflected by deflection prism 34 to a detector side of autofocus device 8 located opposite the illumination side. Detector 9 is arranged in a plane conjugated with the objective pupil and is embodied, for example, as a two-dimensional CCD camera.

The technical data, such as the magnification, wet- or dry-objective status, and numerical aperture, for each objective 2 that is used can be stored in the control application device of the autofocus device. Added to these as necessary are also range indications regarding permitted Z values, i.e. the distance of objective 2 relative to specimen 3. This prevents the front lens element of objective 2 from inadvertently being placed against specimen 3, which can damage said element. Also stored in the control application device of the autofocus device are the thicknesses of the coverslips or Petri dish bases being used for the scheduled examinations. Because the pupil location of an objective generally depends on the particular objective 2 being used, focusing lens 29 is mounted displaceably along the optical axis so that the respective objective pupil location can be optimally imaged onto detector 9. This avoids any displacement of the detector when objective 2 is changed.

In the case of the upright microscope, for example, the side of a coverslip facing away from the specimen can be selected as a position for scanning focus on autofocus interface 7 (coverslip thickness equal to approximately 170 µm), while the visual focus of the microscope is located below the coverslip, i.e. on said interface. This has the advantage that autofocus beam path 4 is directed onto a glass-air surface constituting autofocus interface 7, where it obtains a stronger reflection so that stronger focus signals with better control behavior are generated. Once the visual focus has been adjusted (automatically or visually), the corresponding interference pattern, which is created by reflection of autofocus beam path 4 at autofocus interface 7 and the subsequent interference (as described) of the autofocus sub-beams, is acquired and is stored or saved as a reference interference pattern. In particular, the above-described characteristics or the corresponding data from Fourier transformation of the interference pattern are saved. This reference interference pattern serves for optimum focus adjustment and thus as a setpoint for subsequent regulation of the focus adjustment.

This is then followed by the microscopic examination, during which the scan focus is held constant by means of autofocus device 8, thereby also ensuring that the visual focus remains unchanged.

Figure 6:
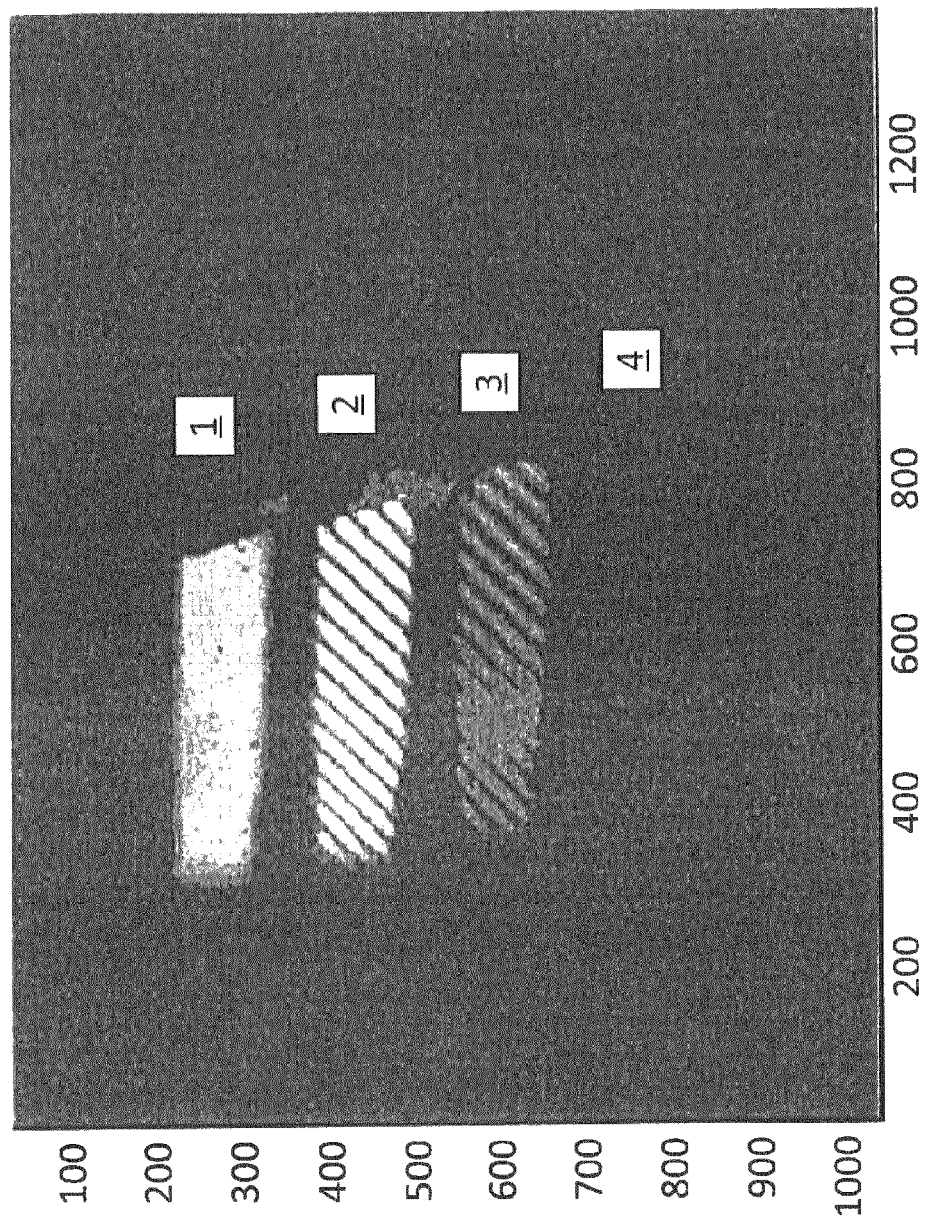
FIG. 6 shows a typical arrangement of interference patterns on a detector surface.

FIG. 6 shows typical interference patterns that occur in the objective pupil with the above-described configuration of an autofocus device 8 having an optical wedge 50 with a wedge angle of 1' and a 20×/0.70 objective 2. The CCD camera used here as autofocus detector 9 has a resolution of 1040×1392 pixels. The axis labels in FIG. 6 correspond to numbers of pixels. The different regions are identified by white-background numbers "1", "2", "3", and "4", where "region 1" results from reflections that derive respectively from the front surface of optical wedge 50. No interference stripe pattern is to be expected here. "Region 2" represents the above-described interferences that are generated by sub-beam 44 (see FIG. 1). The aforementioned higher-order interferences, which are much less bright, are evident in "region 3" and incipiently in "region 4". It is clearly evident that the interference stripes, i.e. the brightness maxima and brightness minima, possess a specific stripe density at a specific stripe slope (referred to an arbitrarily selected axis). Proceeding from this "snapshot," a migration of the stripes is observed as defocusing increases, with a bright stripe, for example, migrating to the location of its neighbor. When a bright stripe ends up in this fashion at the location of the originally adjacent bright stripe, a phase angle of 360 degrees (2π) has been traversed.

Figure 7:
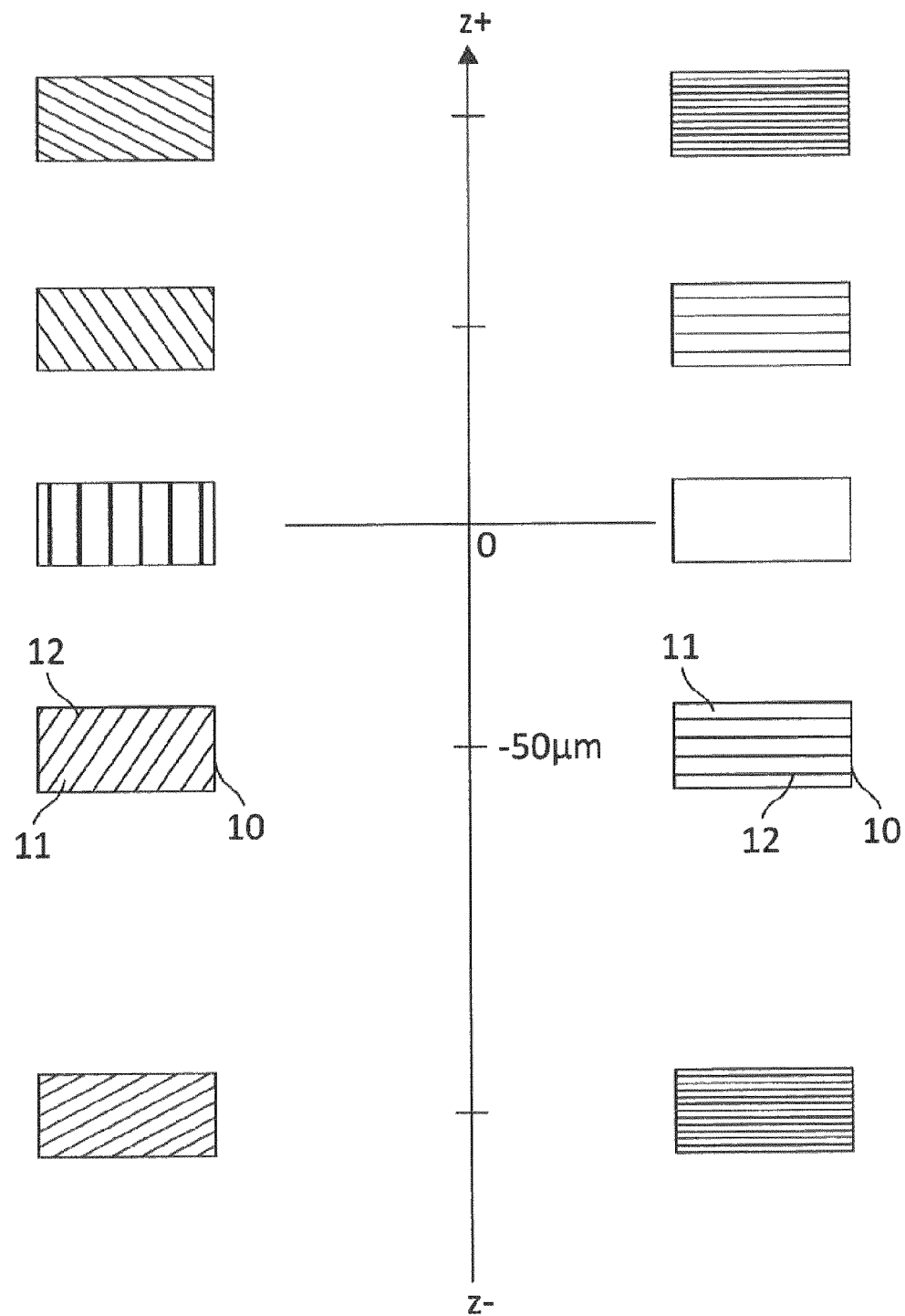
FIG. 7 shows the various interference stripe patterns that are obtained when using a plane-parallel plate or an optical wedge.

FIG. 7 shows, very schematically, the behavior of the interference stripe pattern in the context of defocusing, and the influence of a wedge angle. The right side of FIG. 7 depicts interference patterns (hereinafter always meaning interference patterns from "region 2" on the detector surface) as obtained with a deflection device that has plane-parallel delimiting surfaces 6, 6' (see FIG. 1), i.e. for example a plane-parallel splitter. The left side of FIG. 7, conversely, depicts an interference pattern that is obtained with the use of an optical wedge 50 as deflection device 5. The Z axis is located parallel to the principal axis of objective 2, and its zero point corresponds to the focus position.

The use of a plane-parallel plate (right side of FIG. 7) results, in the focus position (as already described in detail), in a uniformly illuminated "region 2". A defocusing in a positive direction of the Z axis results in a horizontal interference stripe pattern whose density increases with further defocusing. A similar behavior of the interference stripe pattern occurs in the context of a defocusing in a negative direction of the Z axis.

When an optical wedge is used, a typical "baseline" interference is obtained in the focus position (Z=0), namely, in this case, an interference stripe pattern extending in a vertical direction. The orientation of the wedge angle corresponds here to the situation in FIG. 3. It is exhibits a 90-degree rotation of the interference stripes as compared to the situation without a wedge angle. In the context of a defocusing in a positive direction of the Z axis, a slope of the interference stripes in a positive angular direction is observed (starting from the vertical direction of the stripes in the focus position). Upon further defocusing in a positive direction of the Z axis, the slope angle increases even further and the interference stripes approach a horizontal orientation. At the same time, the density of the interference stripes also increases. Similar conditions exist in the context of a defocusing in a negative direction of the Z axis, except that the stripes now slope in the other direction (negative slope angle with reference to the vertical). The stripe density also becomes higher with increasing defocusing.

In principle, both of the capabilities depicted (with and without a wedge) are available for autofocusing. Lastly, the wedge angle can also be oriented differently, so that the "baseline interference" stripe pattern (at Z=0) can possess a definable orientation. On the other hand, FIG. 7 shows clearly that evaluation with a wedge angle can be implemented more reliably, since the "baseline" interference can be considered a reference point, and deviations from that baseline interference are clearly and unequivocally detectable. The direction of defocusing can also be easily identified. Details regarding evaluation are described later on.

Figure 8:
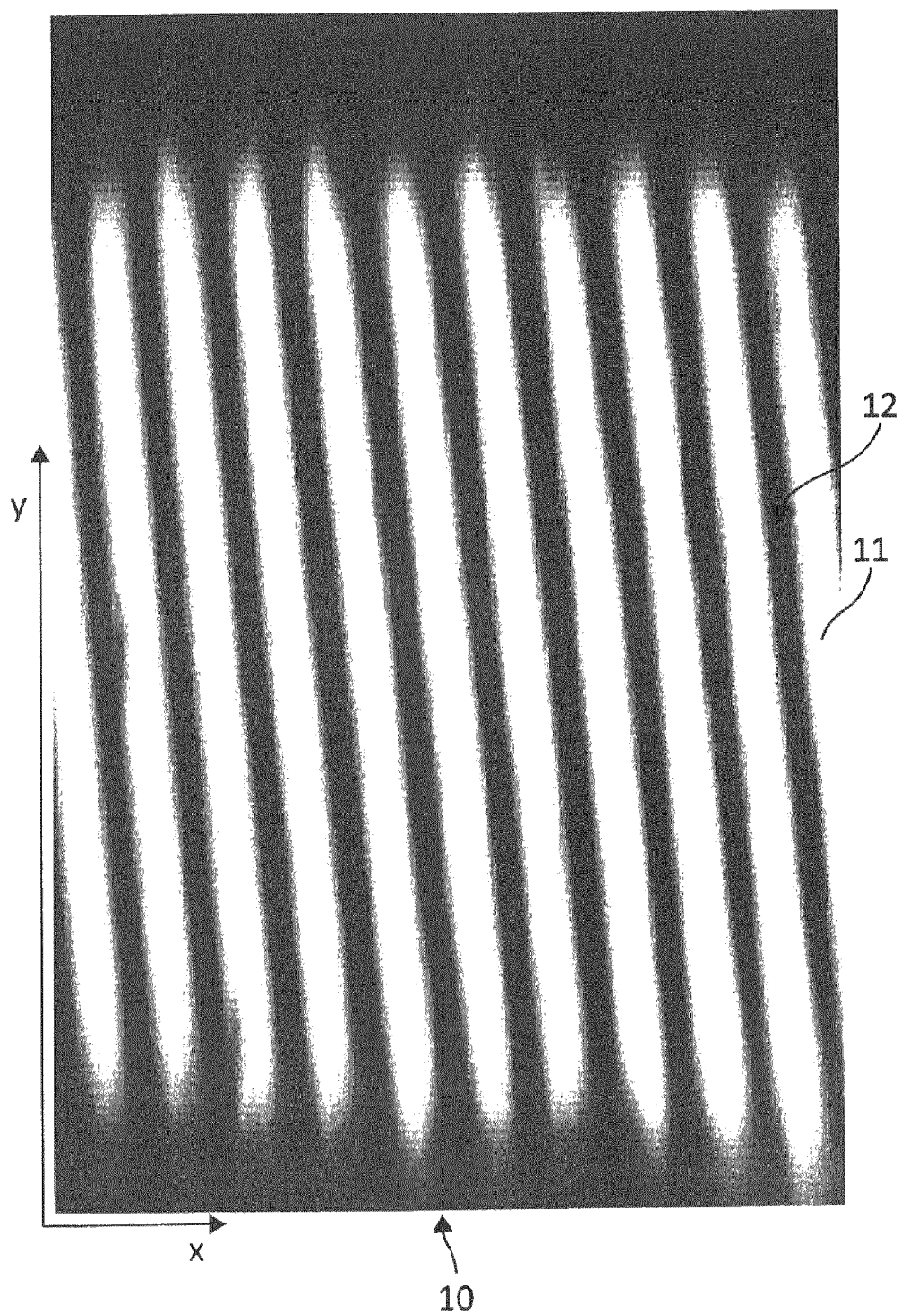
FIG. 8 shows the typical image of an interference stripe pattern that is utilized for evaluation.

FIG. 8 once again shows graphically, in magnified form, a typical interference stripe pattern on the detector surface ("region 2") that can be employed for evaluation.

Before the various possibilities for evaluation are further explained in detail, some insight into the fundamentals of Fourier analysis will be provided. Fourier analysis offers the capability of considering optical processes on the basis of spatial frequencies. With a Fourier transformation, the spatial representation that refers to the parameters of space and time can be transformed into a spatial frequency representation. In fact, each function in the spatial domain can be represented as a superposition of sine and cosine functions of various spatial frequencies. Expressed simply, an arrangement of stripes having a specific density can be construed as a periodic function in the spatial domain. Fourier transformation transforms this periodic structure into the spatial frequency domain and exhibits maxima therein at all the spatial frequencies that are present in that periodic structure.

Because an interference stripe pattern represents a two-dimensional intensity profile on the detector surface, two-dimensional Fourier transformation is used for evaluation. Whereas one-dimensional Fourier transformation signifies a disassembly of the input signal into a cosine component and a sine component, two-dimensional Fourier transformation can be imagined as a disassembly of the input signal into flat waves. If f(x, y) represents the two-dimensional (periodic) function of, for example, the interference stripe pattern, with x and y as coordinates in the spatial domain, then $F(k_x, k_y)$ designates the associated Fourier Transform in the spatial frequency domain, with coordinates $k_x$ and $k_y$ as respective spatial angular frequencies in the X and Y directions. The following correlation exists:

$$f(x, y) = \frac{1}{(2\pi)^2} \int_{-\infty}^{+\infty} \int_{-\infty}^{+\infty} F(k_x, k_y) e^{-i(k_x x + k_y y)} dk_x dk_y$$

$$F(k_x, k_y) = \int_{-\infty}^{+\infty} \int_{-\infty}^{+\infty} f(x, y) e^{i(k_x x + k_y y)} dx dy$$

The Fourier Transform of a sine function in the spatial domain (comparable to the function of an interference stripe pattern in a direction perpendicular to the stripes) contains, for example, inter alia, the spatial frequency as well as the phase. Because of the symmetry of the Fourier Transform, the spatial frequencies are arranged symmetrically with respect to the zero spatial frequency in both the positive and the negative frequency domain. The phase provides information as to the extent to which the sine function in question is shifted to the left or the right with respect to a reference sine function. The Fourier Transform also contains information about contrast, i.e. the difference in brightness between the lightest and the darkest point in the spatial domain (corresponding to maxima and minima of the sine function or to the light and dark stripes in the interference pattern). Lastly, the Fourier Transform contains, at the zero spatial frequency, a principal maximum that represents the average brightness of the region in the spatial domain under consideration. In the case of an interference pattern, this value would therefore always be greater than zero. Very illustrative explanations regarding the properties of Fourier transformation, and regarding the relationship between representations in the spatial domain (stripe patterns and other brightness images) and in the spatial frequency domain (the corresponding Fourier transforms) may be gathered from the article "An intuitive explanation of Fourier theory" by Steven Lehar, at the web site http://cns-alumni bu.edu/~slehar/fourier/fourier.html (a copy of which is provided with the corresponding information disclosure statement). The material dealt with there is assumed as basic knowledge for the discussions that follow.

One-dimensional Fourier transformation is obtained from the above equation for f(x, y) where y=0. The algorithm used very predominantly to calculate a Fourier transformation is referred to as fast Fourier transformation (FFT). For this, firstly the mathematical integration in the above equation is replaced by a summation. The exponential function must be analogously modified, so that what is obtained for the one-dimensional case is $$F(\omega_k) = \sum_{n=0}^{N-1} f_n \cdot e^{-i\omega_k n} \quad k = 0, 1, \ldots, N-1$$

where $$\omega_k = \frac{k 2\pi}{N}, k = 0, 1, \ldots, N-1.$$

Using $$W = e^{\frac{-i 2\pi}{N}},$$

the above equation yields the following for the discrete Fourier Transform:

$$F_k = \sum_{n=0}^{N-1} f_n \cdot W^{k \cdot n}.$$

An analogous expression can be provided for two-dimensional Fourier transformation. This is the starting point for the aforesaid FFT algorithm, in which the computation time required is optimized. Further details about the mathematical fundamentals of Fourier transformation and of the fast Fourier Transform algorithm may be found in the extensive technical literature. The same applies to the physical fundamentals of interferometry. Explicit reference is made in this connection to the textbook "Optik" by E. Hecht, Addison-Wesley Publishing Company. The second edition (1992) of the German version contains a chapter on interference (Chapter 9) and one on Fourier optics (Chapter 11).

Figure 9:
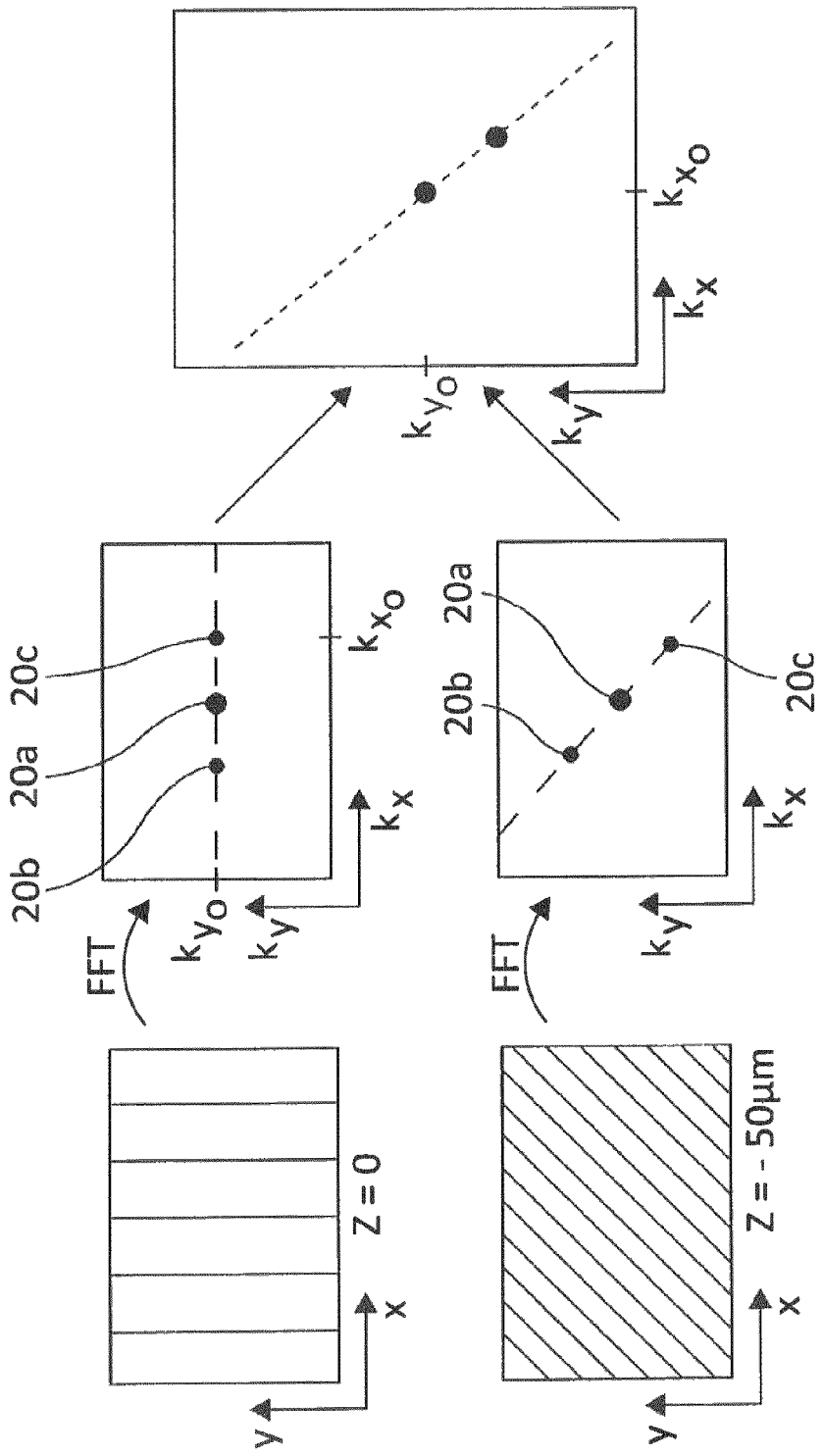
FIG. 9 shows, by way of example, two stripe patterns and their Fourier Transforms, and the calibration curve derived therefrom.

FIG. 9 shows, by way of example, the results of Fourier transformation (two-dimensional FFT) for an interference pattern 10 depicted schematically in FIG. 7, left half, for Z=0 and Z=−50 μm.

For the case in which Z=0, the baseline interference of a vertically extending interference stripe pattern is obtained, while with a defocusing to Z=−50 μm, stripes 11, 12 are sloped and somewhat closer together. The associated Fourier transforms respectively show a principal maximum 20a that describes the average image brightness, as well as secondary maxima 20b, 20c. Their location is characteristic of the spatial frequencies of the respective stripe pattern in the two spatial directions X and Y.

A comparison of the images of the two Fourier transforms shows that the locations of secondary maxima 20b, 20c change both absolutely and relative to one another. For example, the coordinates of the right-hand secondary maximum 20c can be ascertained for many Z positions and assembled into a calibration curve. It is evident that the coordinates ($k_x$, $k_y$) of this plurality of secondary maxima 20c lie on a straight line. A straight line of this kind is particularly preferably suitable as a control curve for focus adjustment, as will be explained later.

Figure 10:
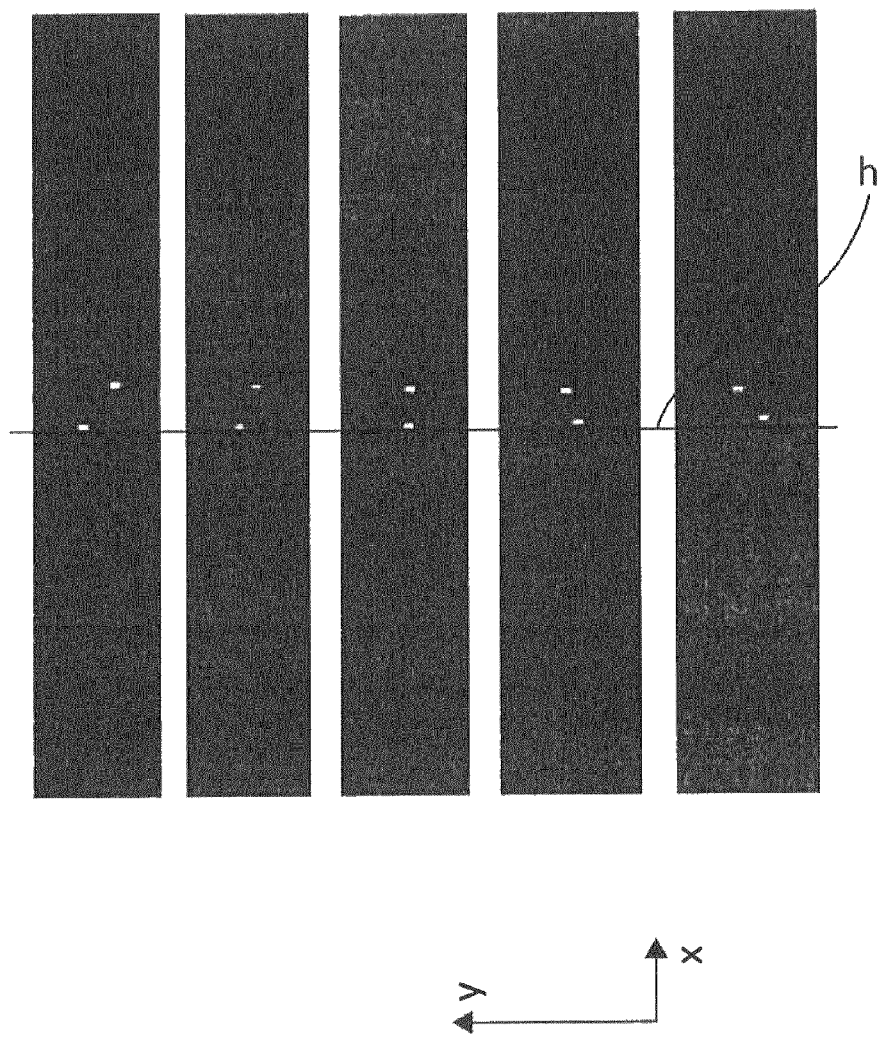
FIG. 10 shows various images of Fourier Transforms of interference stripe patterns at different focus positions.

FIG. 10 shows five images of Fourier transforms that are obtained, using the method explained with reference to FIG. 9, at focus positions of Z=−50 μm, −25 μm, 0 μm, +25 μm, and +50 μm. The two secondary maxima 20b, 20c are depicted as white dots. Using the auxiliary line h it is easy to perceive how, for example, the left-hand secondary maximum 20b shifts (viewed from top to bottom) slightly to the right and even more clearly downward.

FIG. 11 is once again a depiction of the straight line, hereinafter referred to as a "focus characteristic curve," that can be obtained by plotting the $k_x$ and $k_y$ coordinates of one of secondary maxima 20b, 20c. As an alternative to this depiction, a depiction can be selected in which the values $k_y$ can be plotted against Z (or $k_x$ against Z), Z designating the respective focus position (optimum focus at Z=0). A linear focus characteristic curve is obtained with this alternative depiction as well.

Figure 11:
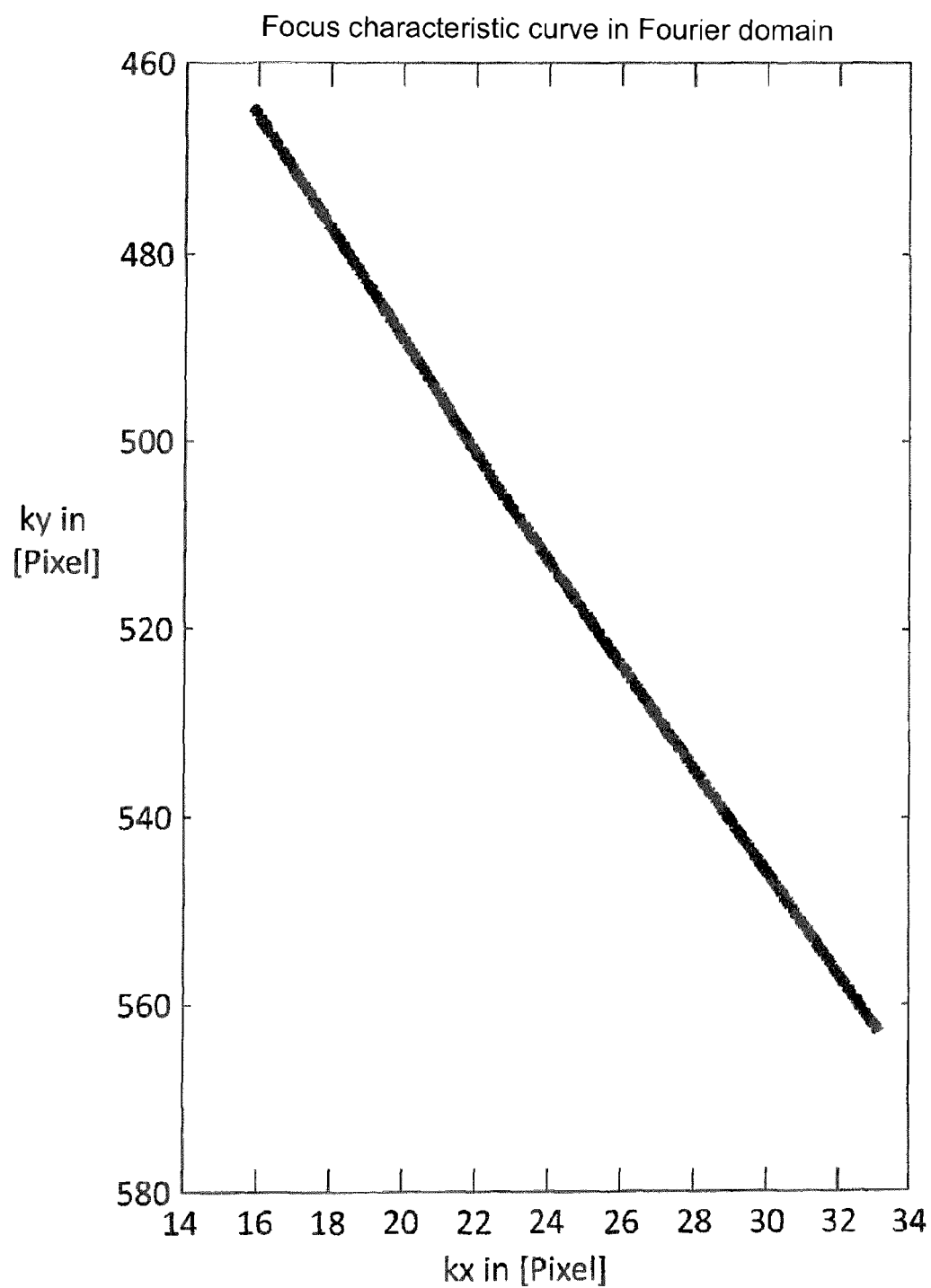
FIG. 11 shows a derived focus characteristic curve for use as a control curve in focus adjustment.

Proceeding from the focus characteristic curve depicted in FIG. 11, focus adjustment can be performed as follows: A specific coordinate value ($k_{x0}$, $k_{y0}$) represents a point on the straight line corresponding to the optimal focus setting. Be it noted that the units of the two axes in FIG. 11 are selected arbitrarily (as pixels). For autofocusing purposes, the interference pattern is evaluated several times per second, for example 20 times per second. For this, the interference stripe pattern is two-dimensionally Fourier transformed by means of FFT. From the Fourier Transform, the coordinates of a secondary maximum are ascertained as described in FIG. 9. If these coordinates ($k_{x0}$, $k_{y0}$) are not identical, a defocusing exists, and it is canceled out by the autofocus device by a corresponding modification of the distance between autofocus interface 7 and objective 2. It is advantageous if a control loop, which controls the deviations from the focus to zero in such a way that the measured coordinates ($k_x$, $k_y$) correspond to the focus coordinates ($k_{x0}$, $k_{y0}$), is present for this purpose. Focus adjustment is accomplished, as a rule, by applying control to the microscope stage.

Figure 12:
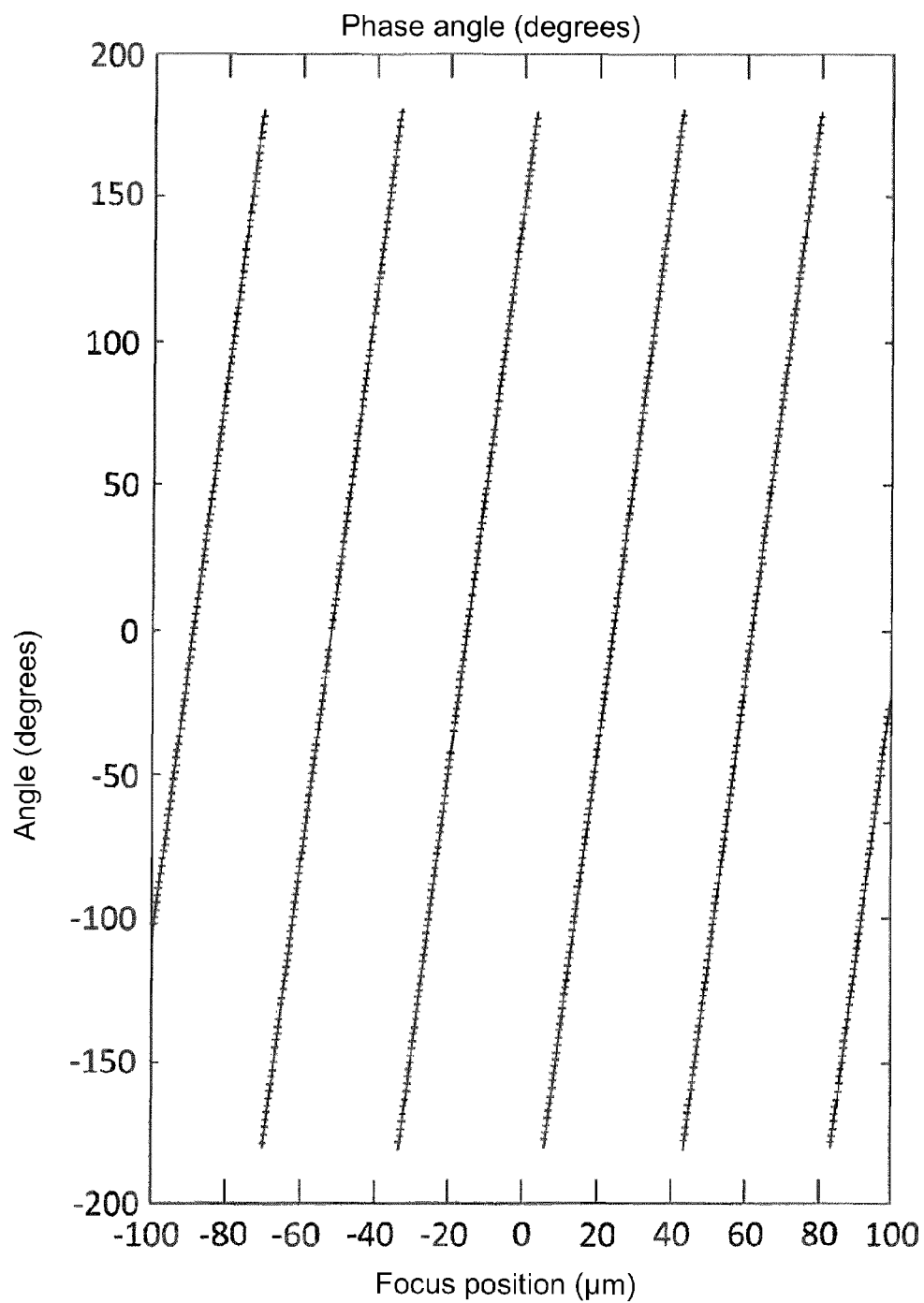
FIG. 12 shows the change in the phase angle of an interference stripe pattern as a function of focus position.

FIG. 12 shows a further characteristic of the interference stripe pattern, namely the phase angle, which can also be determined from the Fourier Transform of the interference stripe pattern 10. This angle is indicated in degrees, and is plotted against the focus position in μm. The steep orientation of the lines, which each pass through the angle region between −180 and +180 degrees and then "jump" back to −180 degrees, is clearly evident. Because of the steep slope of the lines, the phase angle offers a capability for reliably detecting even the slightest deviations from the focus position. Because the line "jumps back" after every approximately 40 μm in the Z direction (focus position), control by way of the phase angle is unequivocally possible only in a region of less than 40 μm around the focus.

It has therefore proven to be particularly advantageous to combine the control approach described on the basis of FIG. 11 with the control approach described with reference to FIG. 12. With a 20×/0.70 objective, for example, it is possible with a control approach according to FIG. 11 to cover a focusing range of +/−150 μm with a focusing accuracy of +/−1 μm. The value of 1 μm corresponds approximately to the depth of field of the objective. If a control approach in accordance with FIG. 12 is additionally used, i.e. if an evaluation of the phase angle is additionally incorporated into the control approach, an accuracy of ⅓ μm, corresponding to one-third of the depth of field, can be achieved. This dual approach is useful because the phase angle, as described, is not unequivocal, and the stripe density (baseline control) and phase angle (fine-scale control) thus usefully complement one another.

Figure 13:
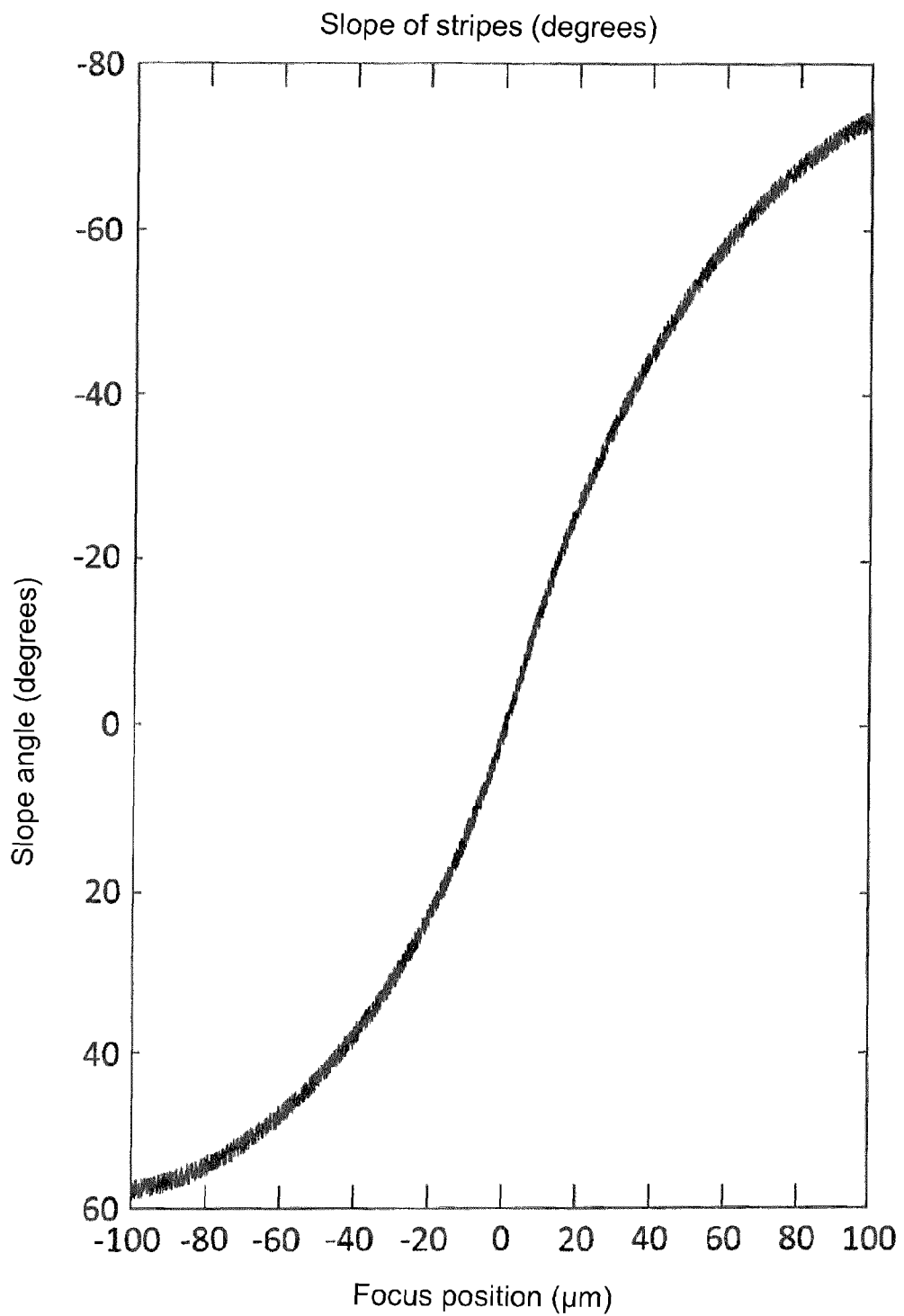
FIG. 13 shows the slope of the stripes in the interference stripe pattern as a function of focus position.

FIG. 13 shows a further characteristic of the interference stripes, namely the previously discussed slope of the stripes (in degrees) plotted against focus position (in μm). It is evident that depending on the "baseline" interference setting, a specific slope angle (in this case, 0 degrees) is present (see FIG. 7, left half). Upon defocusing in a positive direction of the Z axis, a slope angle of the interference stripes occurs; this at first rises almost linearly and then approaches saturation with a decreasing slope. The same behavior is evident, with the opposite sign, for defocusing in a negative direction of the Z axis. The nature of the slope angle in FIG. 13 shows that this curve is also usable as a control curve for focus adjustment. It becomes apparent in practice, however, that a linear control curve (as in FIGS. 11 and 12) is easier to implement in terms of control engineering. It is further apparent that the focus characteristic curve according FIG. 11 and the phase angle according to FIG. 12 represent higher-sensitivity measured variables than the slope of the stripes.

Figure 14:
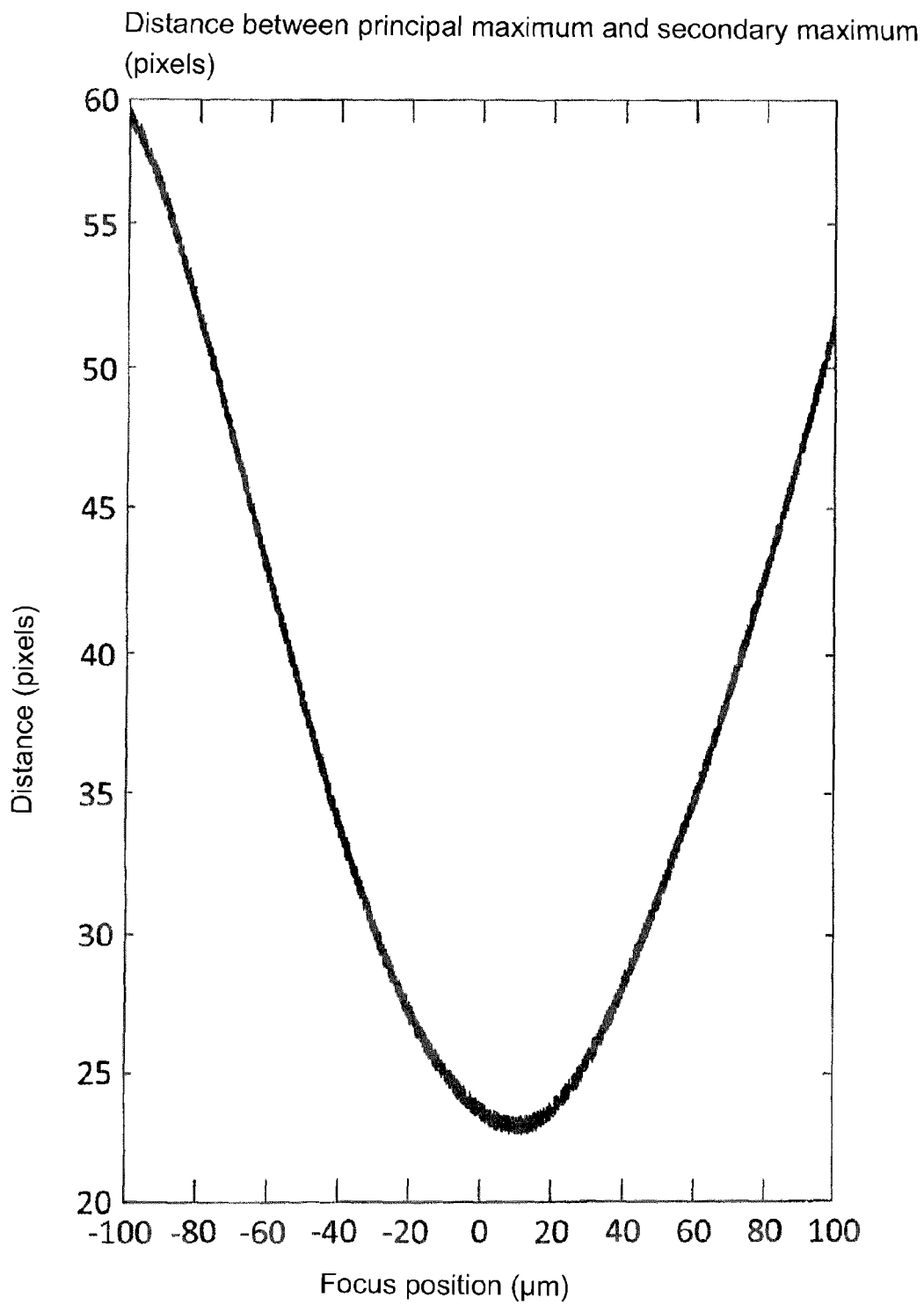
FIG. 14 shows the distance between the principal maximum and a secondary maximum in the Fourier Transform of an interference stripe pattern as a function of focus position.

Lastly, FIG. 14 shows yet another characteristic of the interference stripes, namely the distance between the principal maximum and one of the secondary maxima of the two-dimensional Fourier Transform, plotted as distance (in pixels) against focus position (in μm). What appears is a parabolic curve that, with correct alignment of the optical wedge, is symmetrical with respect to the focus position (zero). Because of the parabolic shape, this characteristic is not unequivocal with regard to focus position, i.e. identical values are obtained for two focus positions that are each at the same distance from the aforesaid vertex.

The exemplifying embodiments discussed have presented preferred evaluation capabilities of specific characteristics of the interference stripe pattern and its Fourier Transform. The examples are not intended to limit the invention, but instead to present the potential and the advantages of the invention. The invention is of course suitable for autofocusing not only in the case of the inverted microscopes discussed, but also in upright microscopes. With regard to upright microscopes, FIGS. 4a and 4b can be imagined as upside down, with Petri dish base 15 then corresponding to a coverslip located on specimen 3. Otherwise all the considerations apply analogously.

PARTS LIST

1 Microscope
2 Microscope objective
3 specimen, sample
4 Autofocus beam path
5 Deflection device
6, 6' Delimiting surface
7 Autofocus interface
8 Autofocus device
9 Autofocus detector
10 Interference pattern
11 Stripe (light)
12 Stripe (dark)
13 Petri dish
14 Air
15 Petri dish base
16 Autofocus illumination optical system
16a Light source
16b Illumination lens
17 Microscope stage
17a Transmitted light opening
18 Observation optical system
20a, 20b, 20c Maxima
21 Fourier Transform
22 Autofocus evaluation unit
23 Focus adjustment device
24 White light source
25 Collector
26 Spectral filter
27 Aperture
28 Illumination optical system
29 Focusing lens
30 Field diaphragm
31 Transport optical system
32 Transport lens
33 Autofocus aperture stop
34 Deflection prism
35 Imaging beam path
41, 42, 43, 44 Sub-beams
50 Optical wedge
51, 52, 53, 54 Regions
γ Wedge angle
h Auxiliary line

What is claimed is:

1. A method for autofocusing in a context of microscopic examination of a specimen, the method comprising:
providing the specimen located at a focus of a microscope objective of a microscope;
providing a deflection device arranged on an opposite side of the microscope objective relative to the specimen;
providing an autofocus beam path directed toward the microscope objective, and from the microscope objective to a reflective autofocus interface in a specimen region, reflecting the autofocus beam path at the autofocus interface and directing the reflected autofocus beam path via the microscope objective and via the deflection device toward an autofocus detector;
generating interfering sub-beams of the autofocus beam path by splitting of the autofocus beam path at two reflecting regions of the deflection device, wherein the sub-beams are spaced apart in a propagation direction of the autofocus beam path, each of the two reflecting regions reflecting a sub-beam of the autofocus beam, whereby two sub-beams both travel through the microscope objective, meet at the focus of the objective and are reflected at the reflective autofocus interface;
arranging the autofocus detector in a plane conjugated with the microscope objective pupil in order to acquire an interference pattern that is generated; and
adjusting the focus of the microscope by using a Fourier transform to (1) evaluate the acquired interference pattern with respect to a phase angle of the interference pattern (2) determine locations of maxima in a planar coordinate system of the Fourier transform of the interference pattern, and (3) evaluate relative locations of the maxima with respect to one another and/or with respect to a location of one of the maxima in the coordinate system of the Fourier transform.

2. The method according to claim 1, wherein the adjusting the focus step further comprises adjusting the focus by evaluating the acquired interference pattern with respect to orientation and/or density of stripes in the interference pattern.

3. The method according to claim 1, wherein the deflection device comprises a dichroic splitter to least partially reflect the autofocus beam path, and wherein two delimiting surfaces of the deflection device are located in the autofocus beam path and form the two reflecting regions that reflect the autofocus beam path.

4. The method according to claim 1, wherein the two reflecting regions of the deflection device extend plane-parallel to one another.

5. The method according to claim 1, wherein the two reflecting regions of the deflection device are each embodied in a planar fashion and extend in a wedge shaped fashion at a wedge angle (γ) to one another.

6. The method according to claim 5, wherein the wedge angle (γ) is selected between 0.5' and 10'.

7. The method according to claim 1, further comprising using either an interface between a coverslip and a sample medium of a specimen slide, or an interface between the coverslip and air facing away from the sample medium, as the autofocus interface for focusing the autofocus beam path in a specimen region.

8. The method according to claim 1, further comprising using either the interface between a Petri dish base and a sample medium of a specimen slide, or an interface between the Petri dish base and air below the Petri dish base facing away from the sample medium, as the autofocus interface for focusing the autofocus beam path in a specimen region.

9. The method according to claim 2, wherein adjusting the focus is accomplished on the basis of evaluating the density of stripes in the interference pattern and then additionally evaluating of the phase angle of the interference pattern for fine adjustment of the focus.

10. A microscope having an autofocus device for adjusting a focus of the microscope comprising:
a microscope objective;
an autofocus illumination optical system for generating an autofocus beam path;
a deflection device comprising two regions that are spaced apart from one another in a propagation direction of the autofocus beam path, each region reflecting the autofocus beam path in order to generate multiple interfering sub-beams, the deflection device being arranged on an opposite side of the microscope relative to a specimen, the deflection device directing the sub-beams toward the microscope objective, to a focus of the microscope objective at a reflective autofocus interface in a specimen region, and the sub-beams are reflected from the autofocus interface back to the microscope objective and to an autofocus detector;
the autofocus detector being arranged in a plane conjugated with the microscope objective pupil in order to acquire an interference pattern;
an autofocus evaluation unit for evaluating the acquired interference pattern; and a focus adjustment device being in working engagement with the autofocus evaluation unit for adjusting the focus of the microscope,
wherein the autofocus evaluation unit adjusts the focus of the microscope by using a Fourier transform to (1) evaluate the acquired interference pattern with respect to a phase angle of the interference pattern (2) determine locations of maxima in a planar coordinate system of the Fourier transform of the interference pattern, and (3) evaluate relative locations of the maxima with respect to one another and/or with respect to a location of one of the maxima in the coordinate system of the Fourier transform.

11. The microscope according to claim 10, wherein the autofocus evaluation unit further comprises adjusting the focus of the microscope by using a Fourier transform to evaluate the acquired interference pattern with respect to orientation and/or density of the stripes in the interference.

12. The microscope according to claim 10, wherein the deflection device comprises a dichroic splitter that at least partially reflects the autofocus beam path, and wherein two delimiting surfaces of the deflection device are located in the autofocus beam path and form the two spaced-apart regions that reflect the autofocus beam path.

13. The microscope according to claim 12, wherein the dichroic splitter is embodied as a plane-parallel plate, and wherein the two spaced-apart regions of the deflection device extend plane-parallel to one another.

14. The microscope according to claim 12, wherein the dichroic splitter is embodied as an optical wedge having a wedge angle (γ), and wherein the two spaced apart regions of the deflection device are each embodied in a planar fashion and extend in a wedge shaped fashion at a wedge angle (γ) to one another.

15. The microscope according to claim 14, wherein the wedge angle (γ) is selected between 0.5' and 10'.

16. The microscope according to claim 10, wherein either an interface between a coverslip and a sample medium of a specimen slide, or an interface between the coverslip and air facing away from the sample medium, serves as the autofocus interface for focusing the autofocus beam path in a specimen region.

17. The microscope according to claim 10, wherein either the interface between a Petri dish base and a sample medium of a specimen slide, or an interface between the Petri dish base and air below the Petri dish base facing away from the sample medium, serves as the autofocus interface for focusing the autofocus beam path in a specimen region.

18. The microscope according to claim 10, wherein the autofocus evaluation unit is configured in such a way that the orientation of the stripes of the interference pattern can be evaluated to cause the focus adjustment device to make a first focus adjustment on the basis of the interference pattern evaluation, and the phase angle of the interference pattern can then be evaluated in order to cause the focus adjustment device to make a fine focus adjustment on the basis of the phase angle evaluation.

19. The microscope according to claim 10, wherein, in order to adjust the focus of the microscope, the focus adjustment device is configured in such a way as to modify a distance between the microscope objective and the autofocus interface, and/or, when a vario objective is used as a microscope objective, to modify a focal length thereof.

20. The microscope according to claim 10, which is an inverted microscope.

21. The microscope according to one of claim 10, wherein an autofocus illumination optical system comprises a white light source with or without a monochromatic filter, or an LED light source.

22. A computer program product having program code means which are stored on a non-transitory computer-readable data medium, for carrying out all steps of the method according to claim 1 when the computer program is executed on a computer or a corresponding computation unit of the autofocus evaluation unit in a microscope.

\* \* \* \* \*